US010692879B2

(12) United States Patent
Lee et al.

(10) Patent No.: US 10,692,879 B2
(45) **Date of Patent: *Jun. 23, 2020**

(54) SEMICONDUCTOR DEVICE INCLUDING DIFFERENT ORIENTATIONS OF MEMORY CELL ARRAY AND PERIPHERAL CIRCUIT TRANSISTORS

(71) Applicant: Samsung Electronics Co., Ltd., Suwon-si, Gyeonggi-do (KR)

(72) Inventors: Sung-Hun Lee, Yongin-si (KR); Jong-Ho Park, Seoul (KR); Joon-Hee Lee, Seongnam-si (KR); Hee-Jueng Lee, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 5 days.

This patent is subject to a terminal disclaimer.

(21) Appl. No.: 16/260,388

(22) Filed: Jan. 29, 2019

(65) Prior Publication Data

US 2019/0164988 A1 May 30, 2019

Related U.S. Application Data

(63) Continuation of application No. 15/285,709, filed on Oct. 5, 2016, now Pat. No. 10,204,918, which is a (Continued)

(30) Foreign Application Priority Data

Jun. 3, 2014 (KR) ........................ 10-2014-0067491

(51) Int. Cl.

| | |
|---|---|
| ***H01L 27/148*** | (2006.01) |
| ***H01L 27/11573*** | (2017.01) |
| ***H01L 27/11582*** | (2017.01) |
| ***H01L 29/04*** | (2006.01) |
| ***H01L 27/11565*** | (2017.01) |
| ***H01L 27/11575*** | (2017.01) |

(52) U.S. Cl.

CPC .. *H01L 27/11573* (2013.01); *H01L 27/11565* (2013.01); *H01L 27/11575* (2013.01); *H01L 27/11582* (2013.01); *H01L 29/045* (2013.01)

(58) Field of Classification Search

None

See application file for complete search history.

(56) References Cited

U.S. PATENT DOCUMENTS

| | | | | |
|---|---|---|---|---|
| 6,067,249 | A | 5/2000 | Lee et al. | |
| 7,772,618 | B2 * | 8/2010 | Gomikawa ........ | G11C 16/0483 257/255 |

(Continued)

FOREIGN PATENT DOCUMENTS

| | | |
|---|---|---|
| JP | 3058948 | 4/2000 |
| JP | 2005-197498 | 7/2005 |
| JP | 2005-197499 | 7/2005 |

*Primary Examiner* — Hung K Vu

(74) *Attorney, Agent, or Firm* — Myers Bigel, P.A.

(57) ABSTRACT

A memory device includes a memory cell on a first region of a substrate. An active region is in a second region neighboring the first region of the substrate, and an extension direction of the active region has an acute angle with the <110> direction of the substrate. A transistor serving as a peripheral circuit is on the second region of the substrate. In the memory device, defects or failures due to a crystal defects or a dislocation of the substrate may decrease.

18 Claims, 19 Drawing Sheets

L 106a 106a 106b 116 106b 116
148d 150 152 148d 144 I
SECOND DIRECTION
FIRST DIRECTION
CELL(FIRST)REGION(20) DUMMY REGION PERIPHERAL REGION SECOND REGION(22)

144
154 123e 148d 123d 148c 123c 148b 123b 148a 123a 10
132 114 112 110 116
<110> <100>
136 138 140 142 108 106a 108 120 118 106b
CELL(FIRST)REGION(20) DUMMY REGION PERIPHERAL REGION SECOND REGION(22)

Related U.S. Application Data continuation of application No. 14/637,538, filed on Mar. 4, 2015, now Pat. No. 9,484,354.

(56) References Cited

U.S. PATENT DOCUMENTS

| | | | | |
|---|---|---|---|---|
| 8,048,798 | B2 | 11/2011 | Kidoh et al. | |
| 8,378,409 | B2 | 2/2013 | Park | |
| 9,484,354 | B2 * | 11/2016 | Lee | H01L 27/11573 |
| 10,204,918 | B2 * | 2/2019 | Lee | H01L 27/11573 |
| 2011/0049611 | A1 | 3/2011 | Kiyotoshi et al. | |
| 2012/0168858 | A1 | 7/2012 | Hong | |
| 2013/0147005 | A1 * | 6/2013 | Hong | H01L 27/04 257/499 |

* cited by examiner 132
114
112
110
116
<100>
108b
120 118
108
106a
108
<110>
130
144
140
138
136
142
122e
124d
122d
124c
122c
124b
122b
124a
122a
10
PERIPHERAL REGION
DUMMY REGION
SECOND REGION(22)
CELL(FIRST)REGION(20)

132
114
112
110
116
<100>
108b
120
118
108
106a
108
<110>
130
144
140
138
136
142
123e
148d
123d
148c
123c
148b
123b
148a
123a
10
PERIPHERAL REGION
DUMMY REGION
SECOND REGION(22)
CELL(FIRST)REGION(20)

SEMICONDUCTOR DEVICE INCLUDING DIFFERENT ORIENTATIONS OF MEMORY CELL ARRAY AND PERIPHERAL CIRCUIT TRANSISTORS

CROSS-REFERENCE TO RELATED APPLICATIONS

This application is a continuation of U.S. application Ser. No. 15/285,709 filed Oct. 5, 2016, now U.S. Pat. No. 10,204,918, which is a continuation of U.S. application Ser. No. 14/637,538, filed Mar. 4, 2015, now U.S. Pat. No. 9,484,354, which claims priority under 35 USC § 119 to Korean Patent Application No. 10-2014-0067491, filed Jun. 3, 2014 in the Korean Intellectual Property Office (KIPO), the contents of which are herein incorporated by reference in their entireties.

BACKGROUND

1. Field

Example embodiments relate to semiconductor devices. More particularly, example embodiments relate to memory devices.

2. Description of the Related Art

Recently, a vertical memory device including a plurality of memory cells vertically stacked on a substrate has been developed. Due to the plurality of memory cells stacked on the substrate, the substrate may have a large amount of stress. Thus, the vertical memory device may have structural and/or electrical defects.

SUMMARY

According to example embodiments, there is provided a semiconductor device. The semiconductor device includes a memory cell, an active region and a transistor. The memory cell is on a first region of a substrate. The active region is in a second region neighboring the first region of the substrate. An extension direction of the active region has an acute angle with the <110> direction of the substrate. The transistor serving as a peripheral circuit is on the second region of the substrate.

In example embodiments, the memory cell may include a channel structure extending in a direction substantially perpendicular to a top surface of the substrate, a dielectric structure on the channel structure, and a plurality of gate lines stacked on the dielectric structure, the plurality of gate lines being spaced apart from each other.

In example embodiments, the gate lines may extend in the <110> direction of the substrate.

In example embodiments, the extension direction of the active region may have an angle of about 10 degrees to about 80 degrees with the <110> direction of the substrate.

In example embodiments, the substrate may be a (100) silicon wafer.

In example embodiments, the semiconductor device may further include a dummy region adjacent to the first region in the second region, and the dummy region may include a dummy active region therein.

In example embodiments, the dummy active region may have a linear shape and may extend in a direction substantially parallel to a boundary line of the first region.

In example embodiments, the dummy active region may extend in the direction having an angle of about 10 degrees to about 80 degrees with the <110> direction of the substrate.

In example embodiments, the dummy active region may include a plurality of dummy active regions regularly arranged in a direction substantially parallel to a boundary line of the first region.

In example embodiments, the transistor may include a gate electrode and an impurity region, and the gate electrode may extend in a direction substantially perpendicular to a longitudinal direction of the active region.

In example embodiments, the transistor may include a gate electrode and an impurity region, and the gate region may extend in the <100> direction of the substrate.

According to other example embodiments, there is provided a semiconductor device. The semiconductor device includes a memory cell, an active region, a transistor and a dummy active region. The memory cell is on a first region of a substrate. The active region is in a second region neighboring the first region of the substrate. An extension direction of the active region has an acute angle with the <110> direction of the substrate. The transistor serving as a peripheral circuit is on the second region of the substrate. The dummy active region is in the second region adjacent to the first region, an extension direction of the dummy active region has an angle of about 10 degrees to about 80 degrees with the <110> direction of the substrate.

In example embodiments, the extension direction of the active region may have an angle of about 10 degrees to about 80 degrees with the <110> direction of the substrate.

In example embodiments, the active region may extend in the <110> direction of the substrate.

In example embodiments, the transistor may include a gate electrode and an impurity region, and the gate region may extend in a direction substantially perpendicular to a longitudinal direction of the active region.

In example embodiments, the dummy active region includes a plurality of dummy active regions regularly arranged in a direction substantially parallel to a boundary line of the first region.

According to yet other example embodiments, there is provided a semiconductor device. The semiconductor device includes a memory cell, an active region, and a transistor. The memory cell is on a first region of a substrate, and a stress of a <110> direction is applied at the memory cell. The active region is in a second region neighboring the first region of the substrate. An extension direction of the active region has an angle of about 10 degrees to about 80 degrees with the <110> direction. The transistor serving as a peripheral circuit is on the second region of the substrate.

In example embodiments, the semiconductor device may further include a dummy region adjacent to the first region in the second region, and the dummy region may include a dummy active region therein.

In example embodiments, the memory cell may include a channel structure extending in a direction substantially perpendicular to a top surface of the substrate, a dielectric structure on the channel structure, and a plurality of gate lines stacked on the dielectric structure, the plurality of gate lines being spaced apart from each other. In example embodiments, the gate lines may extend in the <110> direction of the substrate.

According to still other example embodiments, there is provided a semiconductor device comprising a substrate comprising a <110> direction. A memory cell array comprises a plurality of word lines that extend along the substrate parallel or perpendicular to the <110> direction. A plurality of peripheral circuit transistors extend along the substrate oblique to the <110> direction.

In example embodiments, the plurality of peripheral circuit transistors extend along the substrate at an angle of between about 10 degrees and about 80 degrees to the <110> direction.

In example embodiments, a plurality of dummy active regions are provided between the memory cell array and the plurality of peripheral cell transistors, the dummy active regions not comprising transistors therein.

In example embodiments, the memory cell array further comprises a plurality of memory cells having channel structures that extend perpendicular to a face of the substrate.

In example embodiments, the substrate comprises monocrystalline silicon and also comprises a <100> direction, and the plurality of peripheral circuit transistors extend along the <100> direction.

According to example embodiments, an active region of a peripheral region may be formed to have an acute angle to a boundary line of a cell region so that a stress smaller than a stress due to a pressure of the <110> direction may be generated at the peripheral region. When the vertical memory cells are formed on the cell region, the stress of the peripheral region may decrease. Thus, a crystal defect or a dislocation of the peripheral region due to the stress may decrease, so that leakage currents of a transistor in a peripheral circuit may decrease.

BRIEF DESCRIPTION OF THE DRAWINGS

Example embodiments will be more clearly understood from the following detailed description taken in conjunction with the accompanying drawings.

FIG. 1 is a plan view illustrating a vertical semiconductor device in accordance with example embodiments.

FIG. 2 is a cross-sectional view cut along a line I-I' of FIG. 1.

FIG. 3 is a plan view illustrating a substrate for forming the vertical semiconductor device and a crystal orientation of the substrate.

FIG. 4 is a plan view illustrating a layout of regions of the vertical semiconductor device.

FIG. 5 is a perspective view illustrating a layout of an active region in second region of FIG. 1.

FIGS. 6 to 15 are cross-sectional views and plan views illustrating stages of a method of manufacturing the vertical semiconductor of FIGS. 1 and 2.

FIG. 16 is a plan view illustrating a vertical semiconductor device in accordance with example embodiments.

FIG. 17 is a plan view illustrating a vertical semiconductor device in accordance with example embodiments.

FIG. 18 is a plan view illustrating a vertical semiconductor device in accordance with example embodiments.

FIG. 19 is a cross-sectional view illustrating a vertical semiconductor device in accordance with example embodiments.

FIG. 20 is a block diagram illustrating an electronic system including a semiconductor device in accordance with example embodiments.

DESCRIPTION OF EMBODIMENTS

Figure 1:
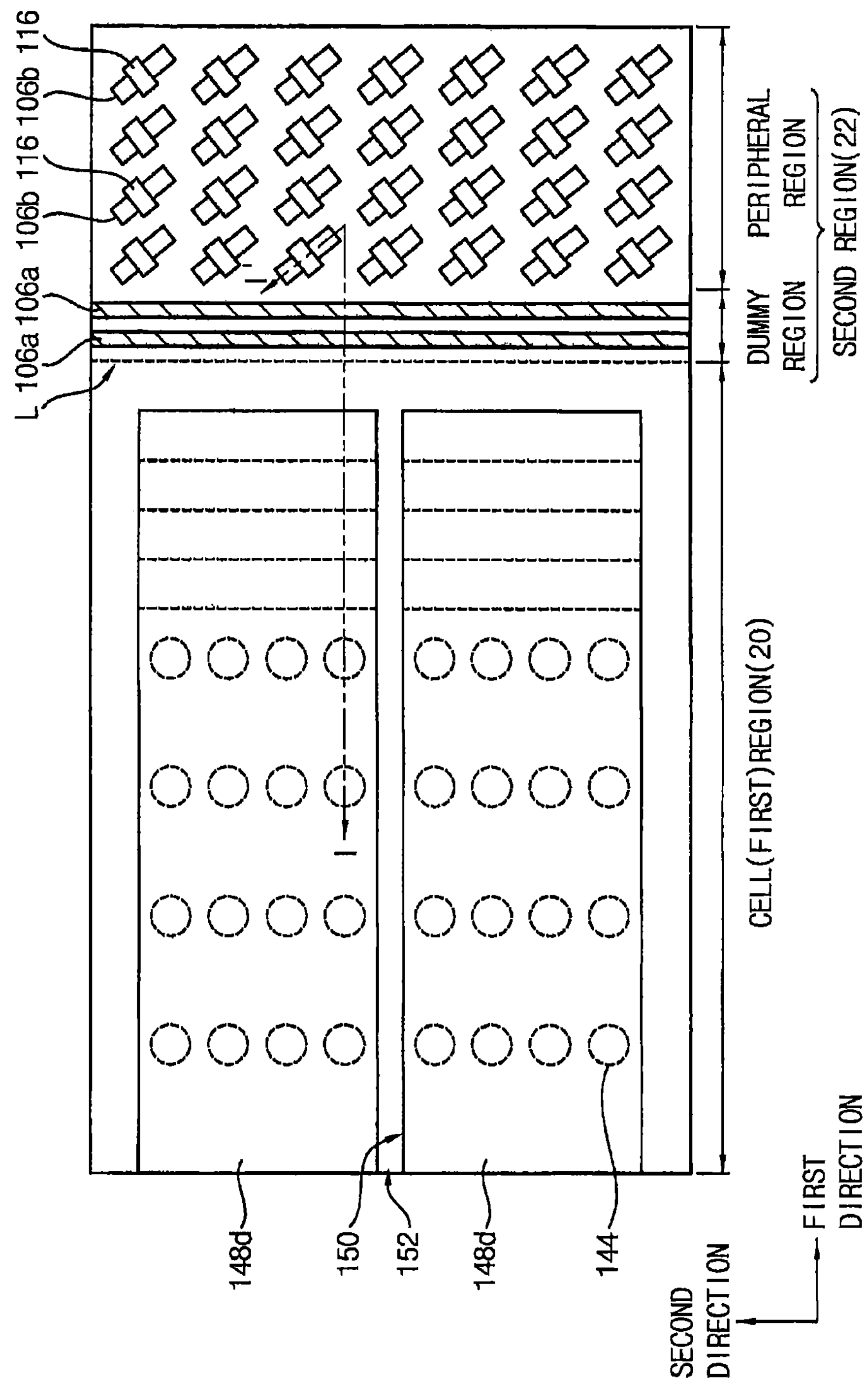
FIGS. 1 to 20 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
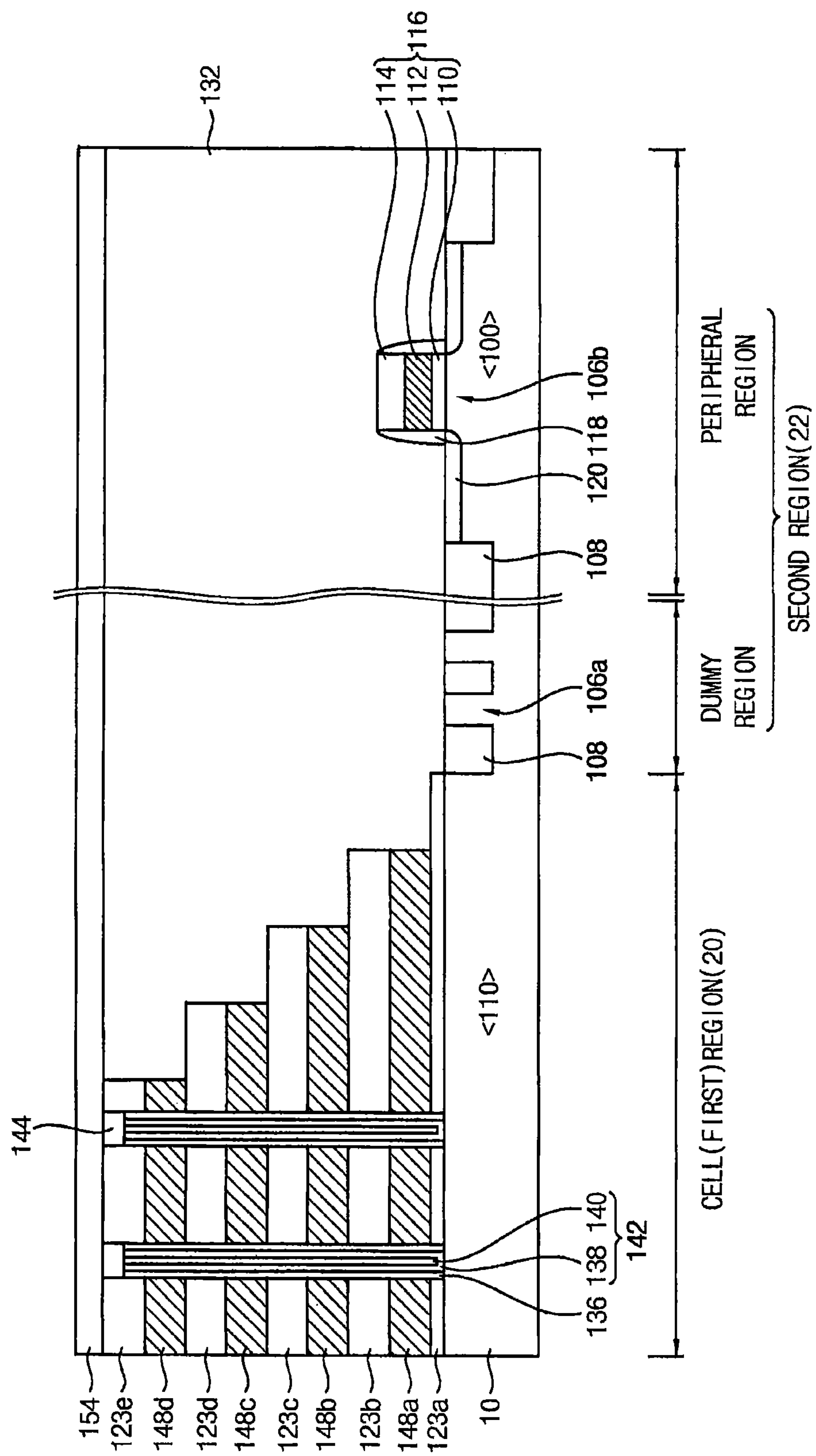
Figure 3:
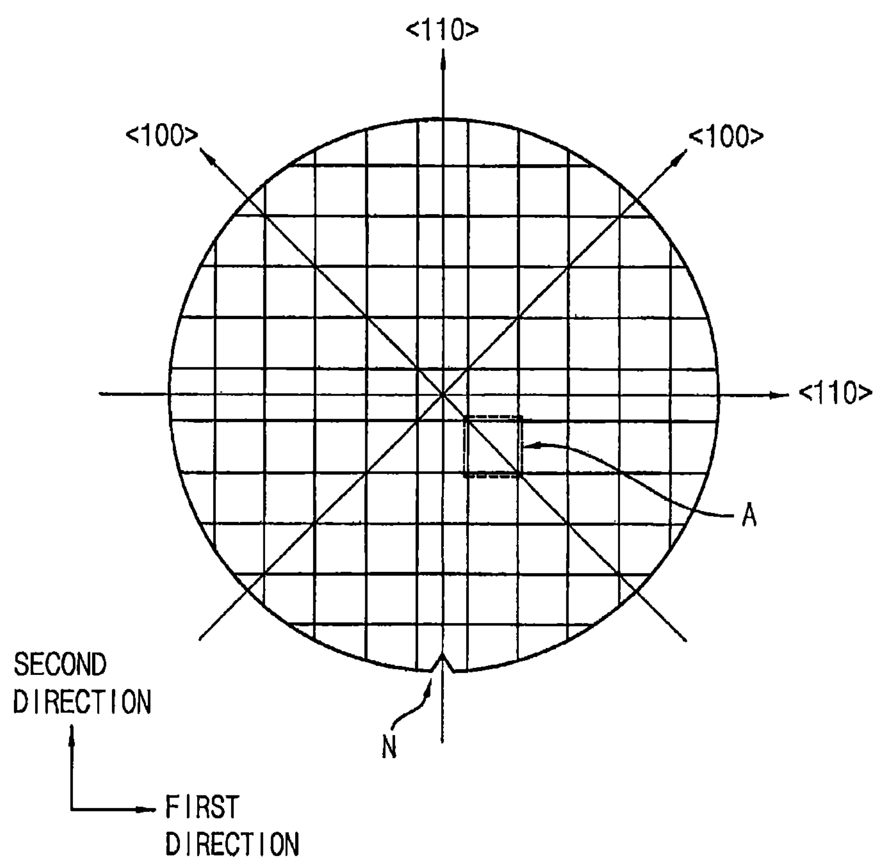
Figure 4:
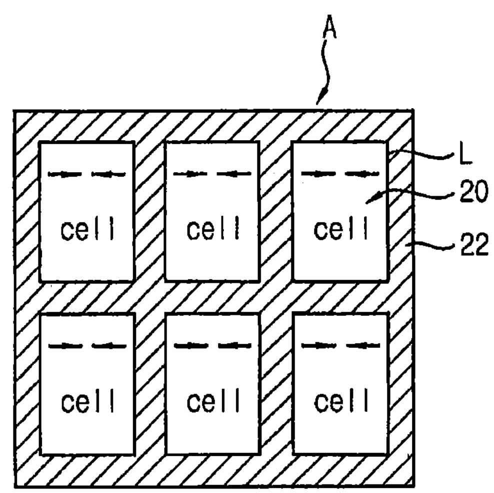
Figure 5:
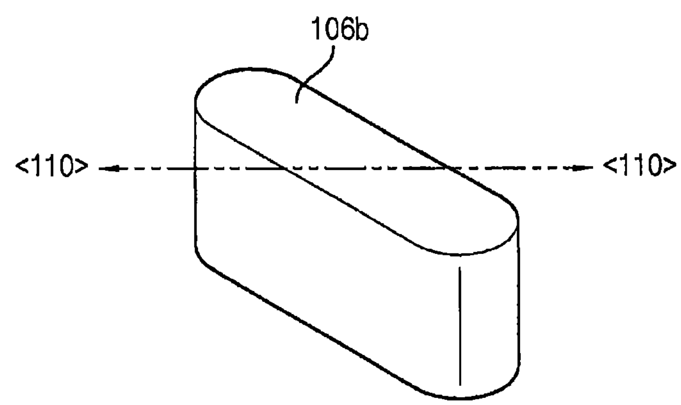

FIG. 1 is a plan view illustrating a vertical semiconductor device in accordance with example embodiments. FIG. 2 is a cross-sectional view cut along a line I-I' of FIG. 1. FIG. 3 is a plan view illustrating a substrate for forming the vertical semiconductor device and a crystal orientation of the substrate. FIG. 4 is a plan view illustrating a layout of regions of the vertical semiconductor device. FIG. 5 is a perspective view illustrating a layout of an active region in a second region of FIG. 1.

Referring to FIGS. 1 to 5, a substrate 10 may include monocrystalline silicon and may have the (100) crystalline plane. Thus, the substrate 10 may be referred to as a (100) silicon wafer.

Referring to FIG. 3, a crystal orientation of the (100) silicon wafer in first and second directions, which may be substantially parallel to a top surface of the substrate 10 and substantially perpendicular to each other, may be the <110> direction. The first direction may be substantially parallel to the orientation of a notch N or a flat zone of the (100) silicon wafer. That is, the (100) silicon wafer may be referred to as a flat zone <110> wafer. The (100) silicon wafer may be generally used for manufacturing of a semiconductor device.

A plurality of vertical memory devices may be formed on the substrate 10, and each of the vertical memory devices may be formed in a chip area A of a quadrilateral shape, such as a rectangular shape, having four sides extending in the first and second directions.

Referring to FIGS. 1 and 4, the chip area A of the substrate 10 may include a first region 20 and a second region 22. The first region 20 may serve as a cell region for forming memory cells, and the second region 22 may include a dummy region and a peripheral region. The first region 20 may have a quadrilateral shape, such as a rectangular shape, having four sides extending in the first and second directions. Thus, each of boundary lines L of the first region 20 may extend in the first direction or in the second direction. That is, the boundary lines L of the first region 20 may extend in the <110> direction.

The dummy region may be located between the first region 20 and the peripheral region. The second region 22 may be adjacent to the first region 20. As shown in FIG. 4, a plurality of first regions 20 may be located in the chip area A. The second region 22 may be located between the first regions 20.

The memory cells may be stacked on the first region 20 in a third direction substantially perpendicular to the top surface of the substrate 10. The memory cells may include a vertical channel structure 142, a dielectric structure 136, a plurality of gate lines 148a, 148b, 148c and 148d, and a bit line (not shown). The vertical channel structure 142 may extend in the third direction on the first region 20 of the substrate 10. The dielectric structure 136 may be formed on a sidewall of the vertical channel structure 142, and may include a tunnel insulation layer (not shown), a charge storage layer (not shown) and a blocking layer (not shown). The gate lines 148a, 148b, 148c and 148d may be formed on a sidewall of dielectric structure 136 to be spaced apart from each other. The bit line may be formed on an upper surface of the vertical channel structure 142. The bit line and each of the gate lines 148a, 148b, 148c and 148d may be substantially perpendicular to each other. The gate lines 148a, 148b, 148c and 148d may extend in one of the first and second directions, and the bit line may extend in the other one of the first and second directions, that is, in a direction substantially perpendicular to the extension direction of the gate lines 148a, 148b, 148c and 148d. Thus, the gate lines 148a, 148b, 148c and 148d may extend in the <110> direction. In example embodiments, the gate lines 148a, 148b, 148c and 148d may extend in the first direction.

Hereinafter, the memory cells shown in FIG. 2 will be described. However, the structure of the memory cells may not be limited thereto, and the memory cells may have various other structures.

The vertical channel structure 142 may include a channel layer 138 and a filling layer 140. The channel layer 138 may be formed on the substrate 10, and may have a hollow cylindrical shape or a cup shape. Alternatively, the channel layer 138 may have a pillar shape, and in this case, the vertical channel structure 142 may not have the filling layer 140. Other shapes, such as polygonal shapes, also may be provided. The channel layer 138 may include a single crystalline silicon or polysilicon. The filling layer 140 may fill an inner space formed by the channel layer 138.

The tunnel insulation layer may include an oxide, e.g., silicon oxide, the charge storage layer may include a nitride, e.g., silicon nitride, and the blocking layer may include an oxide, e.g., silicon oxide or a metal oxide such as hafnium oxide, aluminum oxide, etc. In example embodiments, the dielectric structure 136 including the tunnel insulation layer, the blocking layer, and the blocking layer may have an ONO structure including an oxide layer, a nitride layer and an oxide layer sequentially stacked.

The gate lines 148a, 148b, 148c and 148d may be formed on the blocking layer, and may be spaced apart from each other in the third direction. Each of the gate lines 148a, 148b, 148c and 148d may surround the sidewall of the vertical channel structure 142, and may extend in the first direction.

In example embodiments, a lowermost one of the gate lines 148a, 148b, 148c and 148d, or the lowermost one and a nearest one thereto over the lowermost one of the gate lines 148a, 148b, 148c and 148d may serve as a ground select line (GSL), and an uppermost one of the gate lines 148a, 148b, 148c and 148d, or the uppermost one and a nearest one thereto under the uppermost one of the gate lines 148a, 148b, 148c and 148d may serve as a string select line (SSL). Others of the gate lines 148a, 148b, 148c and 148d between the GSL and the SSL may serve as a word line.

Insulating interlayer patterns 123a, 123b, 123c, 123d and 123e may be formed between the gate lines 148a, 148b, 148c and 148d in the third direction. The insulating interlayer patterns 123a, 123b, 123c, 123d and 123e may include, an oxide, e.g., silicon oxide, SiOC, SiOF, etc. The gate lines 148a, 148b, 148c and 148d may be electrically insulated from each other by the insulating interlayer patterns 123a, 123b, 123c, 123d and 123e.

As shown in FIGS. 1 and 2, a stacked structure including the gate lines 148a, 148b, 148c and 148d and the insulating interlayer patterns 123a, 123b, 123c, 123d and 123e may have a length in the first direction that may decrease from a bottom toward a top in the third direction. In example embodiments, the stacked structure including the gate lines 148a, 148b, 148c and 148d and the insulating interlayer patterns 123a, 123b, 123c, 123d and 123e may have a stepped shape. In example embodiments, a plurality of stacked structures may be formed in the first region 20.

A division pattern 152 may be formed between the stacked structures adjacent to each other in the second direction. The stacked structures may be separated by the division pattern 152, and the gate lines 148a, 148b, 148c and 148d extending in the first direction in each of the stacked structures may be restricted by the division pattern 152 along the second direction.

A second impurity region (not shown) may be formed at an upper portion of the substrate 10 adjacent to the division pattern 152. The second impurity region may extend in the first direction and serve as a common source line (CSL) of the vertical semiconductor device.

The bit line may be electrically connected to the vertical channel structure 142. The bit line may extend in a direction substantially perpendicular to the extension direction of the gate lines 123a, 123b, 123c, 123d and 123e, which may be the second direction.

An isolation layer pattern 108 may be formed at the second region of the substrate 10, and a field region and an active region may be defined in the substrate 10.

A first active region 106a may be formed in the dummy region of the second region 22. The first active region 106a may serve as a dummy active region on which no actual circuits may be formed. The first active region 106a may reduce or prevent elements from being polished or removed on the second region 22 when a chemical mechanical polishing (CMP) process is performed. The first active region 106a may have a linear shape extending in a direction substantially parallel to the boundary line (L) of the first region 20. That is, the first active region 106a may extend in the <110> direction.

A peripheral circuit may be formed on the peripheral region of the second region 22. The peripheral circuit may include a CMOS transistor.

A second active region 106b for forming the transistor may be formed at the peripheral region of the second region 22. The second active region 106b may be disposed to have an oblique angle, and in some embodiments an acute angle, with the <110> direction.

That is, a longitudinal direction of the second active region 106b may be neither perpendicular nor parallel to the boundary line (L) of the first region 20, but may have an oblique angle, and in some embodiments an acute angle, therewith.

In example embodiments, the second active region 106b may be disposed to have an angle of about 10 degrees to about 80 degrees to the boundary line (L) of the first region 20. When the second active region 106b is disposed to have an angle of 45 degrees to the boundary line (L) of the first region 20, the second active region 106b may be disposed in the <100> direction.

An elastic modulus of the substrate 10 may vary depending on the crystal orientation of silicon in the substrate 10. The elastic modulus may be proportional to a stress of the substrate 10, and thus the stress of the substrate 10 may be changed according to the crystal orientation of silicon in the substrate 10. For example, in a single crystalline (monocrystalline) silicon substrate, an elastic modulus of the <100> direction may be smaller than that of the <110> direction. Thus, a stress of the substrate 10 due to a pressure in the <110> direction may be greater than a stress of the substrate 10 due to a pressure in the <100> direction.

In example embodiments, the second active region 106b may be disposed in a direction different from the <110> direction, so that the stress of the substrate 10 may decrease.

For forming sacrificial layer patterns and the insulating interlayer patterns 123a, 123b, 123c, 123d and 123e on the first region 20, a depositing process and an etching process may be performed at a high temperature. Accordingly, as different layers may be alternatively and repeatedly deposited on the first region 20, a mechanical stress may be applied to the first region 20. Also, a thermal stress may be applied to the first region 20 during the depositing and etching processes. The thermal stress and mechanical stress of the first region 20 may transfer to the second region 22 of the substrate 10, so that defects or damages, e.g., a change of chemical structure or a dislocation, etc., may be generated at the second region 22 of the substrate 10.

The sacrificial layer patterns and the insulating interlayer patterns 123a, 123b, 123c, 123d and 123e may be disposed in the <110> direction, so that an excessive compressive stress in the <110> direction may be applied to the first region 20 of the substrate 10. Thus, a tensile stress in the <110> direction may be applied to the second region 22 adjacent to the first region 20. Due to the tensile stress, a crystal defect or a dislocation may occur at a weak portion of the second region 22 of the substrate 10.

However, in example embodiments, the second active region 106b may be disposed in a direction different from the <110> direction. Thus, a direction of the compressive stress from the first region 20 to the second active region 106b may not be identical to the longitudinal direction of the second active region 106b. Also, the second active region 106b may be disposed in a direction having a small elastic modulus so that a small stress may be applied to the second active region 106. The stress applied to the second active region 106b from the first region 20 may be dispersed. Also, the second active region 106b may have a relatively small stress when compared to the second active region 106b disposed in the <110> direction.

Thus, the crystal defect or the dislocation in the second active region 106b due to the stress applied from the first region 20 may decrease. Also, defects or failures of the peripheral circuit due to the crystal defect or the dislocation in the second active region 106b may decrease.

A gate structure 116 including a gate insulation layer pattern 110, a gate electrode 112 and a gate mask 114 may be formed on the second region 22 of the substrate 10.

In example embodiments, the gate structure 116 may be disposed in a direction substantially perpendicular to the longitudinal direction of the second active region 106b. That is, the gate structure 116 may be disposed in a direction different from the <100> direction so as to decrease an effect of the stress. Thus, failures of the gate structure 116 such as a crack or a deformation may decrease.

In example embodiments, gate spacers 118 may be further formed on sidewalls of the gate structure 116.

A first impurity region 120 may be formed at an upper portion of the second active region 106b adjacent to the gate structure 116. A CMOS transistor may include the gate structure 116 and the first impurity region 120, and the first impurity region 120 may serve as a source region or a drain region of the CMOS transistor.

Accordingly, as the crystal defect or the dislocation in the second active region 106*b* may decrease, electrical defects or failures of the transistor such as leakage currents may decrease. Thus, the vertical semiconductor device may have a high reliability.

FIGS. 6 to 15 are cross-sectional views and plan views illustrating stages of a method of manufacturing the vertical semiconductor device of FIG. 1.

Figure 6:
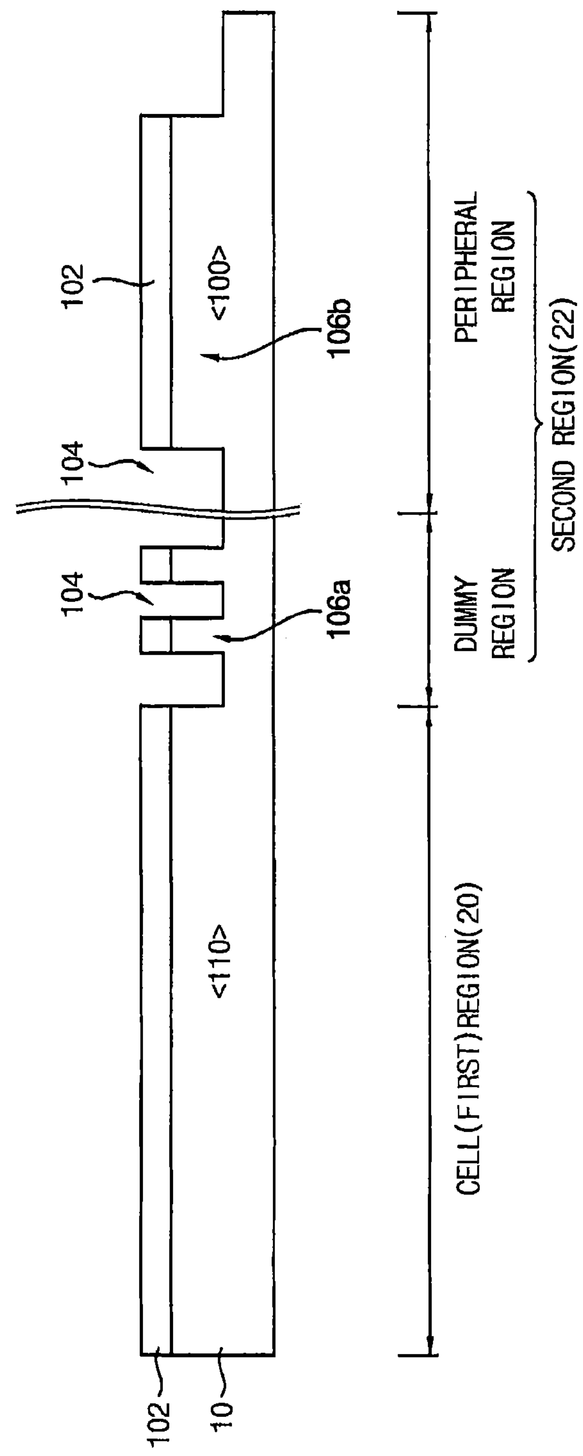
Figure 7:
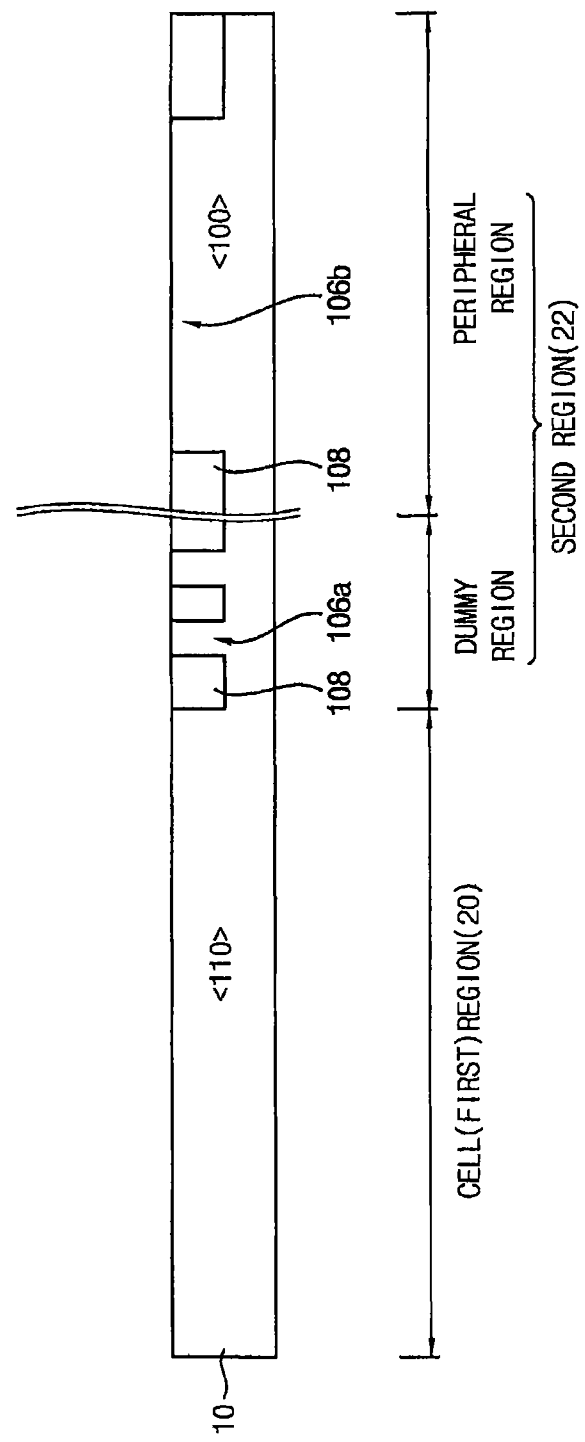
Figure 8:
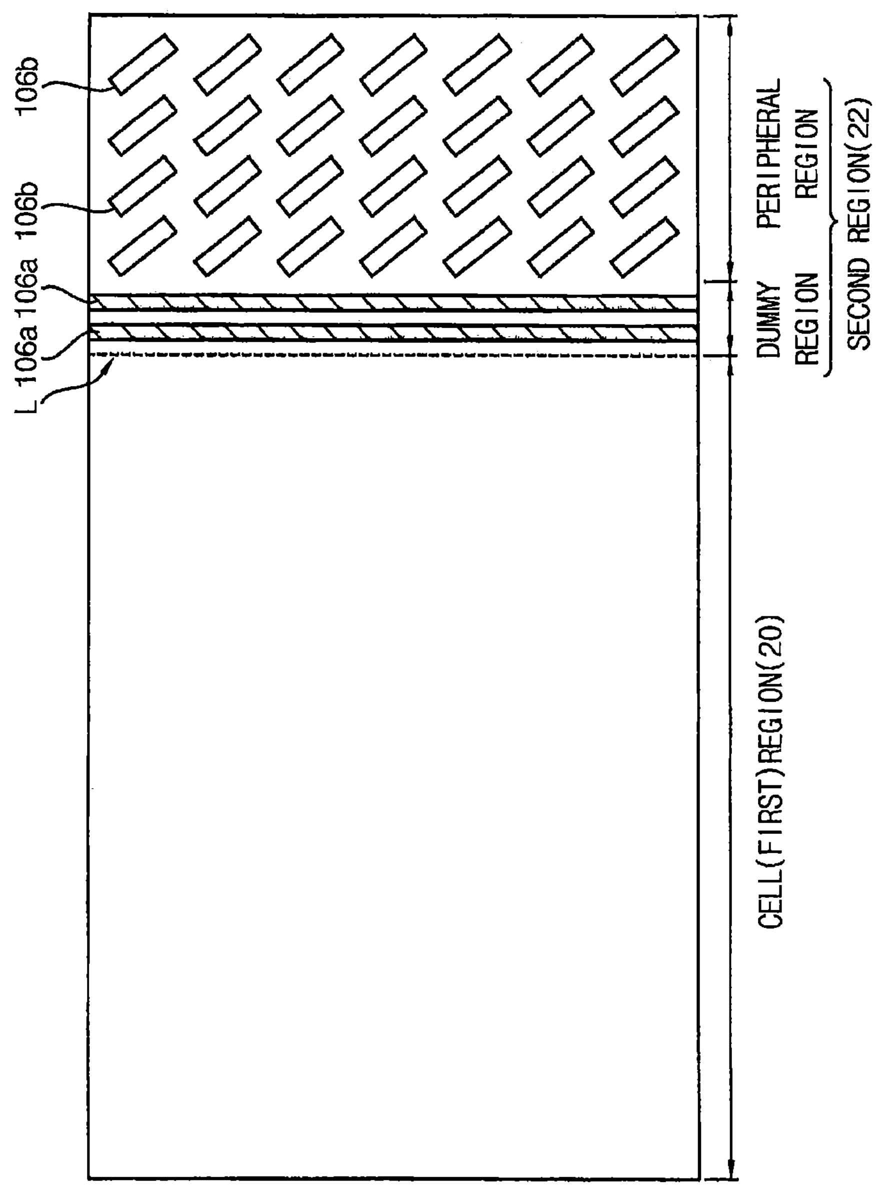
Figure 9:
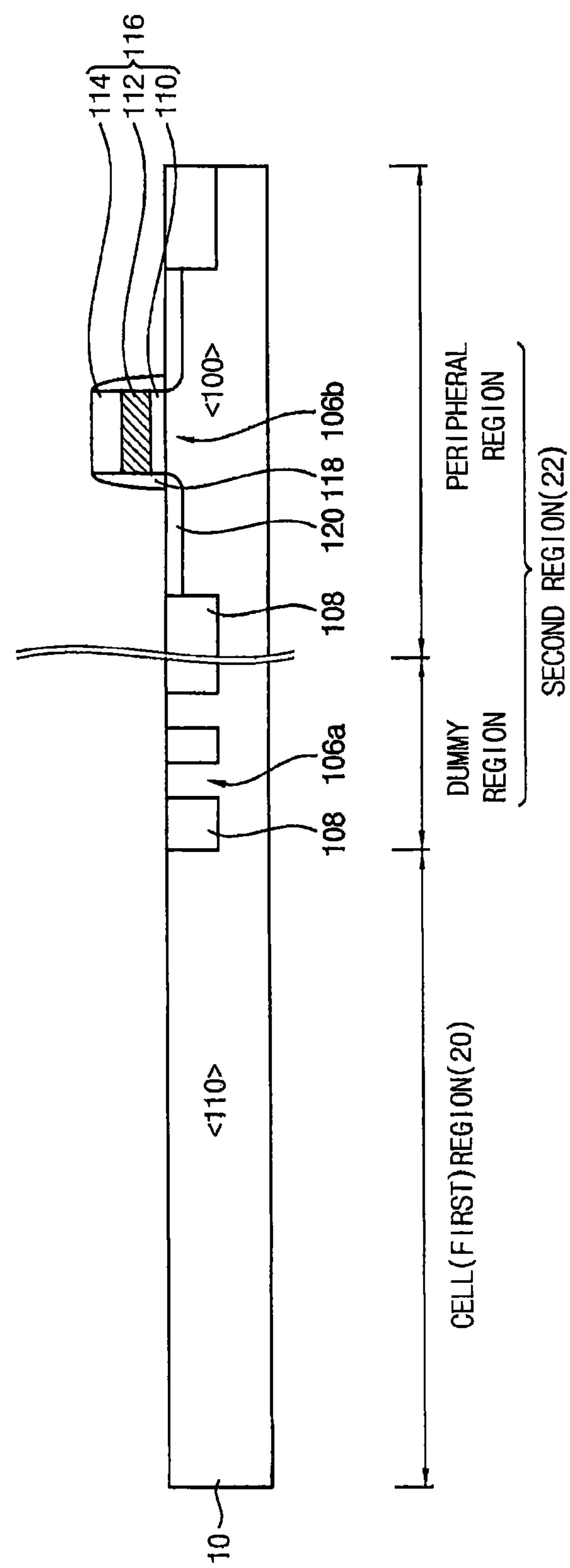
Figure 10:
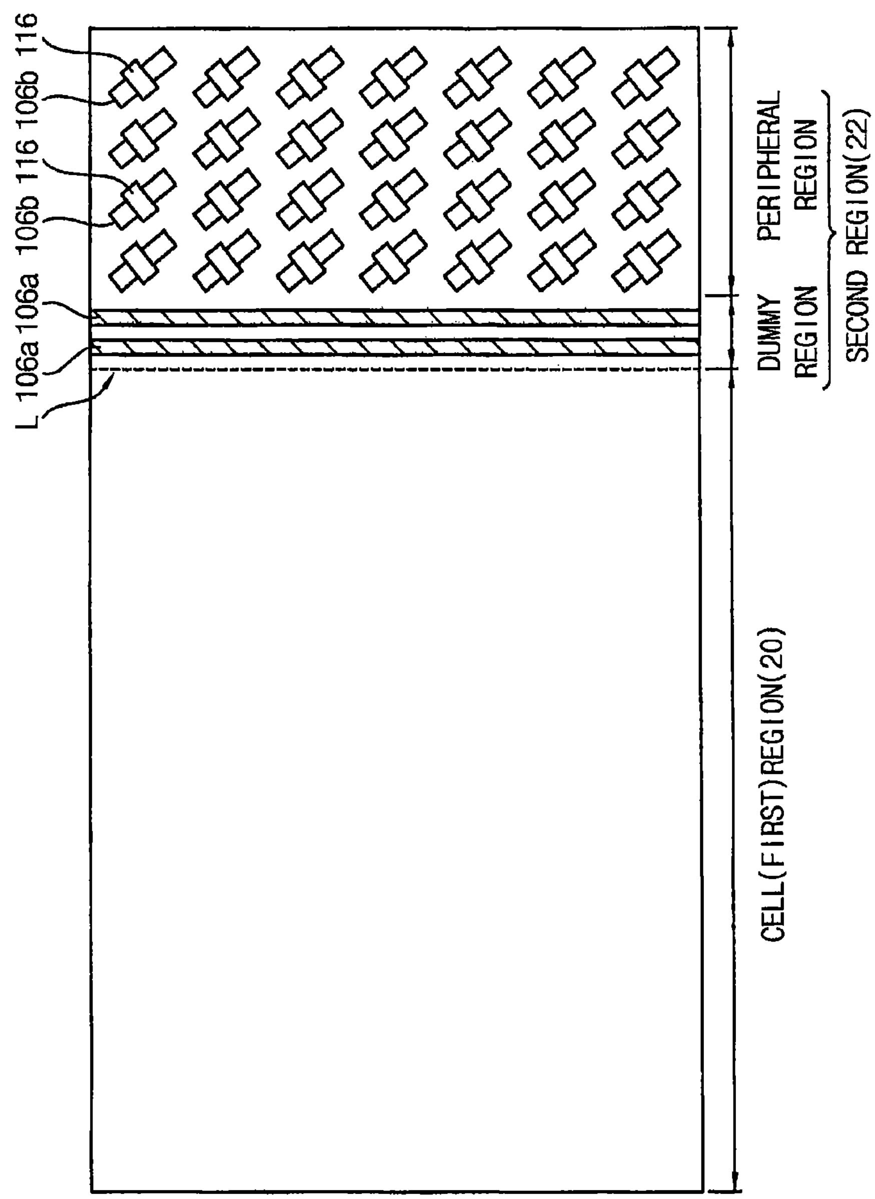

Particularly, FIGS. 6, 7, 9 and 11 to 15 are cross-sectional views, and FIGS. 8 and 10 are plan views.

Referring to FIG. 6, a substrate 10 may be a (100) silicon wafer. In the (100) silicon wafer, a crystal orientation of the substrate 10 in first and second directions may be the <110> direction. The (100) silicon wafer may be referred to as a flat zone <110> wafer. The (100) silicon wafer may be generally used for manufacturing of a semiconductor device.

A chip area A of the substrate 10 for forming the vertical semiconductor device may include a first region 20 and a second region 22. The first region 20 may serve as a cell region for forming memory cells, and the second region 22 may include a dummy region and a peripheral region. The first region 20 may have a quadrilateral shape, such as a rectangular shape, having four sides extending in the first and second directions. Thus, each of boundary lines of the first region 20 may extend in one of the first and second directions.

An etching mask 102 for forming first and second active regions 106*a* and 106*b* may be formed on the first and second regions 20 and 22 of the substrate 10. A field region of the second region 22 may be etched using the etching mask 102 to form trenches 104. Portions of the second region 22 between the trenches 104 may serve as an active region 106*a* and 106*b*, respectively. A first active region 106*a* may be formed in the dummy region, and a second region 106*b* may be formed in the peripheral region.

The first active region 106*a* may be formed to extend in the <110> direction. The first active region 106*a* may be formed to have a linear shape extending in a direction substantially parallel to the boundary line of the first region 20. In example embodiments, a plurality of first active regions 106*a* may be formed, and the plurality of first active regions 106*a* may be substantially parallel to each other.

The second active region 106*b* may be formed to have an oblique angle, such as an acute angle, with the <110> direction. In example embodiments, the second active region 106*b* may be formed to have an angle of about 10 degrees to about 80 degrees with the <110> direction. That is, the second active region 106*b* may be neither perpendicular nor parallel to the boundary line of the first region 20, but may have an acute angle therewith. When the second active region 106*b* is formed to have an angle of 45 degrees with the boundary line L (refer to FIG. 8) of the first region 20, a longitudinal direction of the second active region 106*b* may be disposed in the <100> direction.

Referring to FIGS. 7 and 8, an insulation layer (not shown) may be formed on the substrate 10 in, and in some embodiments to fill, the trenches 104, and may be planarized until a top surface of the substrate 10 may be exposed, and thus an isolation layer pattern 108 may be formed in each of the trenches 104. The first active region 106*a*, the second active region 106*b* and the field region in the second region 22 of the substrate 10 may be defined by the isolation layer pattern 108.

Referring to FIGS. 9 and 10, a gate insulation layer, a gate electrode layer and a gate mask layer may be sequentially formed on the substrate 10. The gate mask layer may be patterned by a photolithography process to form a gate mask 114. The gate mask 114 may be formed in the second region 22 of the substrate 10, and may be disposed in a direction substantially perpendicular to the longitudinal direction of the second active region 106*b*.

The gate electrode layer and the gate insulation layer may be etched using the gate mask 114 as an etching mask to form a gate electrode 112 and a gate insulation pattern 110, respectively. Thus, a gate structure 116 including the gate insulation layer pattern 110, the gate electrode 112 and the gate mask 114 may be formed on the second region 22 of the substrate 10. The gate structure 116 may be formed on a portion of the second active region 106*b*, and may be disposed in a direction substantially perpendicular to the longitudinal direction of the second active region 106*b*.

The gate insulation layer may be formed to include an oxide, e.g., silicon oxide, a metal oxide, etc., the gate electrode layer may be formed to include, e.g., a metal, a metal nitride, polysilicon, etc., and the gate mask layer may be formed to include a nitride, e.g., silicon nitride. The gate insulation layer, the gate electrode layer and the gate mask layer may be formed by a chemical vapor deposition (CVD) process, a plasma enhanced chemical vapor deposition (PE-CVD) process, a high density plasma chemical vapor deposition (HDP-CVD) process, an atomic layer deposition (ALD) process, a sputtering process, etc. Alternatively, the gate insulation layer may be formed on an upper portion of the substrate 10 by a thermal oxidation process.

Impurities may be doped onto the second active region 106*b* adjacent to the gate structure 116 by an ion implantation process to form a first impurity region 120. The gate structure 116 and the first impurity region 120 may form a MOS transistor of a peripheral circuit.

The second active region 106*b* may be disposed in a direction different from the <110> direction, so that the transistor on the second region 22 may have a reduced effect of a stress. If the second active region 106*b* is disposed in the <100> direction, the transistor formed on the (100) silicon wafer may have an operation characteristic substantially the same as or similar to that of a transistor formed on the (110) silicon wafer.

In example embodiments, a spacer layer may be formed on the substrate 10, on, and in some embodiments to cover, the gate structure 116, and the spacer layer may be anisotropically etched to form gate spacers 118 on sidewalls of the gate structure 116.

Figure 11:
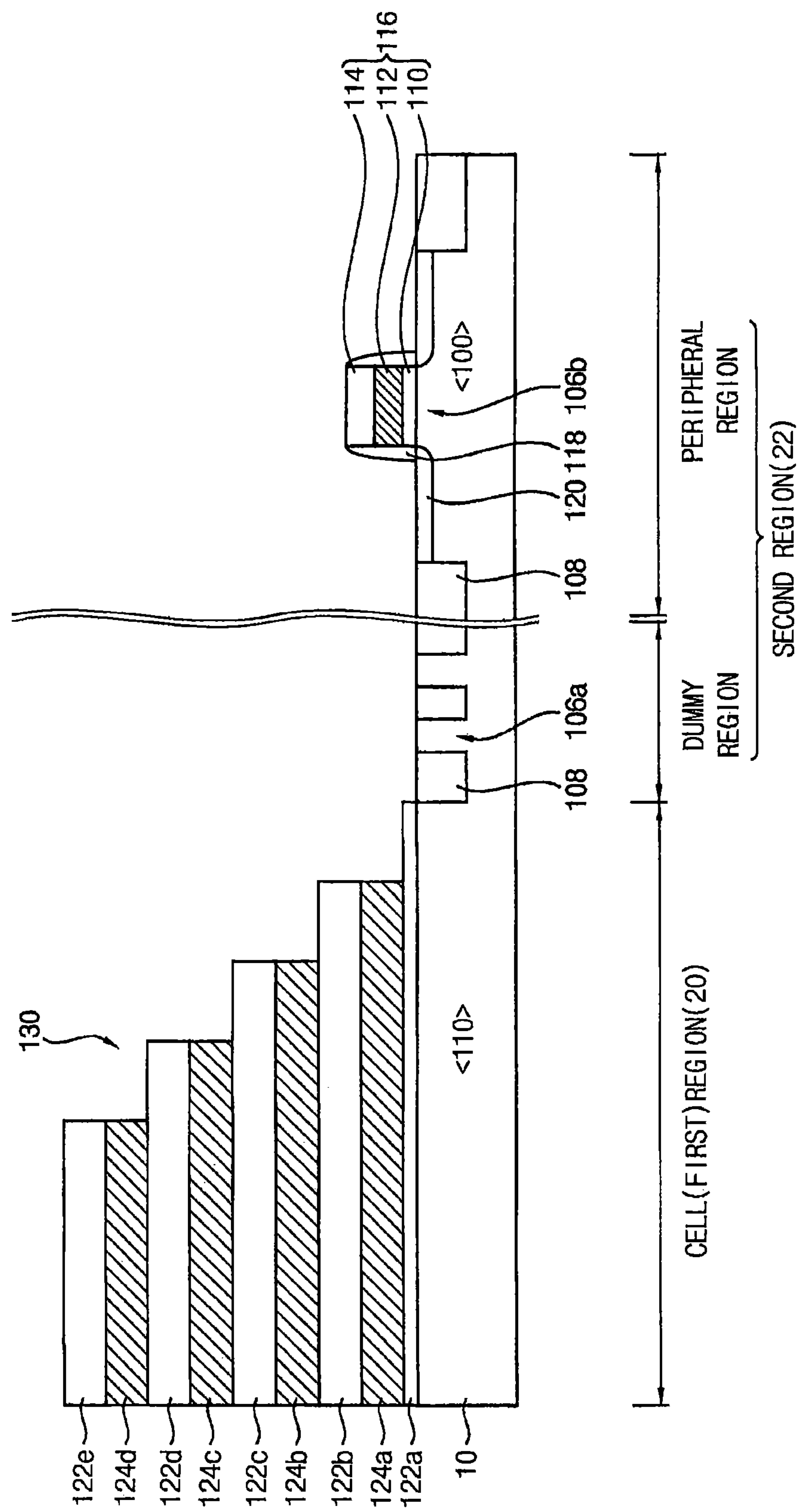

Referring to FIG. 11, insulating interlayers 122*a*, 122*b*, 122*c*, 122*d* and 122*e* and sacrificial layers 124*a*, 124*b*, 124*c* and 124*d* may be alternately and repeatedly formed on the substrate 10. Thus, a preliminary mold structure including the insulating interlayers and sacrificial layers may be formed.

In example embodiments, the insulating interlayers 122*a*, 122*b*, 122*c*, 122*d* and 122*e* may be formed to include, e.g., silicon oxide, SiOC, SiOF, etc. The sacrificial layers 124*a*, 124*b*, 124*c* and 124*d* may be formed to include a material having an etching selectivity with respect to the insulating interlayers 122*a*, 122*b*, 122*c*, 122*d* and 122*e*. Also, the sacrificial layers 124*a*, 124*b*, 124*c* and 124*d* may be formed to include a material that may be easily removed by a wet etching process. The sacrificial layers 124*a*, 124*b*, 124*c* and 124*d* may be formed to include a nitride, e.g., silicon nitride, SiBN, etc.

The sacrificial layers 124*a*, 124*b*, 124*c* and 124*d* may be removed by subsequent processes to form gaps 146 (refer to FIG. 14), and the gaps 146 may provide spaces for forming a GSL, a word line and a SSL. Thus, the numbers of the insulating interlayers 122*a*, 122*b*, 122*c*, 122*d* and 122*e* and the sacrificial layers 124*a*, 124*b*, 124*c* and 124*d* may be determined according to the numbers of the GSL, the word line and the SSL subsequently stacked.

The insulating interlayers 122*a*, 122*b*, 122*c*, 122*d* and 122*e* and sacrificial layers 124*a*, 124*b*, 124*c* and 124*d* may be partially etched to form a mold structure 130 having a stepped shape.

In example embodiments, a first photoresist pattern (not shown) may be formed on an uppermost one of the insulating interlayers 122*e*, and edge portions of the insulating interlayers 122*a*, 122*b*, 122*c*, 122*d* and 122*e* and the sacrificial layers 124*a*, 124*b*, 124*c* and 124*d* may be etched using the first photoresist pattern as an etching mask. Then, edge portions of the first photoresist pattern may be partially removed to form a second photoresist pattern (not shown) having a width smaller than that of the first photoresist pattern, and edge portions of the insulating interlayers 122*a*, 122*b*, 122*c*, 122*d* and 122*e* and the sacrificial layers 124*a*, 124*b*, 124*c* and 124*d* may be etched again using the second photoresist pattern as an etching mask. By repeatedly performing the etching process, the mold structure 130 may be formed.

In example embodiments, the insulating interlayers 122*a*, 122*b*, 122*c*, 122*d* and 122*e* and sacrificial layers 124*a*, 124*b*, 124*c* and 124*d* formed on the second region 22 may be removed by the etching process for forming the mold structure 130. In the etching process for forming the mold structure 130, the gate structure 116 on the second region 22 may be protected by a protection layer (not shown).

As described above, the mold structure 130 may include a plurality of layers stacked on the first region 20 of the substrate 10. The mold structure 130 may apply a stress to the first region 20 of the substrate 10. As the numbers of the layers included in the mold structure 130 may increase, the stress of the first region 20 of the substrate 10 may increase. Also, the stress of first region 20 of the substrate 10 may transfer to the second region 22 of the substrate 10, and thus the stress may be applied to the second region 22 of the substrate 10.

A compressive stress may be applied to the first region 20 of the substrate 10 having the mold structure 130 thereon, and thus a tensile stress may be applied to the second region of the substrate 10 adjacent to the first region 20. However, in example embodiments, the second active region 106*b* in the second region 22 may have a relatively small elastic modulus, and the tensile stress applied to the second region 22 may be dispersed. Thus, a crystal defect or a dislocation of the second active region 106*b* may decrease.

Figure 12:
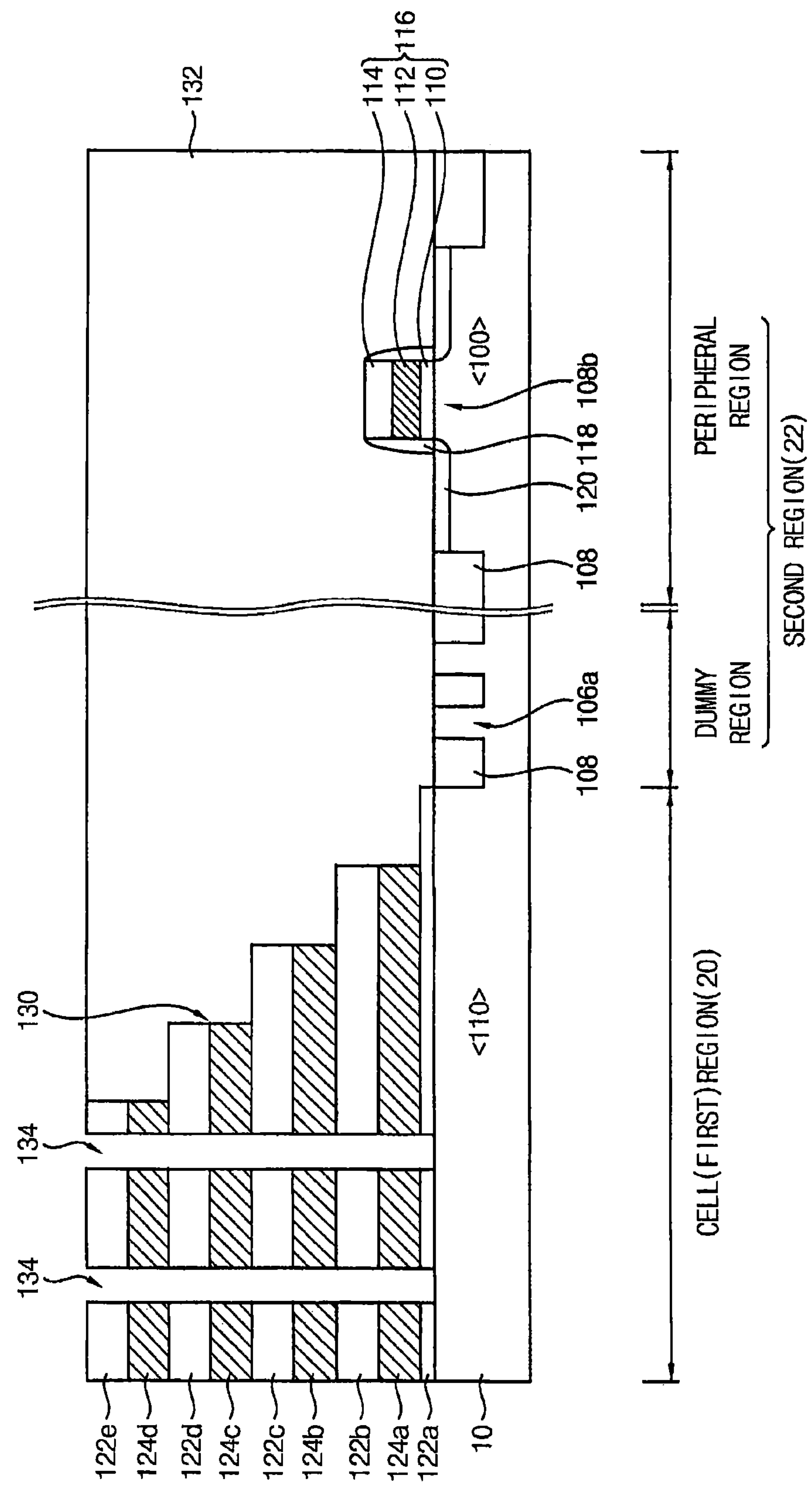

Referring to FIG. 12, an insulation layer (not shown) may be formed on the substrate 10 on, and in some embodiments to cover, the mold structure 130, and the insulation layer may be planarized until a top surface of the mold structure 130 may be exposed to form a first upper insulation layer 132. In example embodiments, the planarization process may be performed by a chemical mechanical polishing (CMP) process and/or an etch back process.

A plurality of channel holes 134 may be formed through the mold structure 130.

In example embodiments, a hard mask (not shown) may be formed on an uppermost one of the insulating interlayers 122*e*, and the mold structure 130 including the insulating interlayers 122*a*, 122*b*, 122*c*, 122*d* and 122*e* and the sacrificial layers 124*a*, 124*b*, 124*c* and 124*d* may be etched using the hard mask as an etching mask to form the channel holes 134. The channel holes 134 may extend in the third direction to expose top surfaces of the substrate 10.

Figure 13:
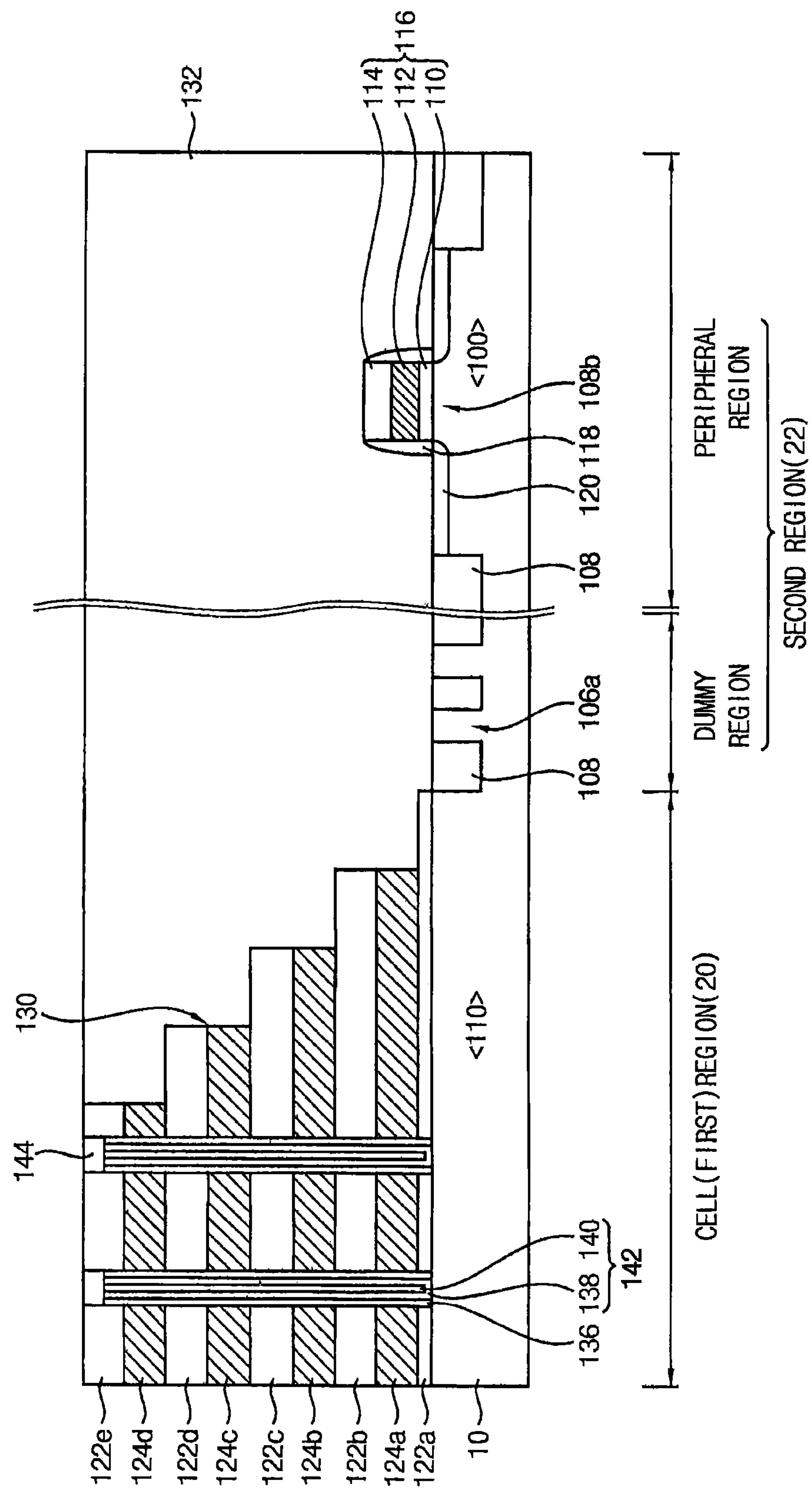

Referring to FIG. 13, a blocking layer, a charge storage layer and a tunnel insulation layer may be sequentially formed on inner walls of the channel holes 134, top surfaces of the uppermost one of the insulating interlayers 122*e*, and a top surface of the first upper insulation layer 132. Thus, a dielectric structure 136 including the blocking layer, the charge storage layer and the tunnel insulation layer may be formed. The blocking layer may be formed to include an oxide, e.g., silicon oxide, the charge storage layer may be firmed to include a nitride, e.g., silicon nitride, and the tunnel insulation layer may be formed to include an oxide, e.g., silicon oxide or a metal oxide, e.g., hafnium oxide, aluminum oxide, etc. In example embodiments, the dielectric structure 136 may be formed to have an ONO structure including an oxide layer, a nitride layer and an oxide layer sequentially stacked.

The dielectric structure 136 on the bottom surfaces of the channel holes 134 may be etched by an etch back process to expose top surfaces of the substrate 10.

A channel layer 138 may be formed on the dielectric structure 136 and the exposed top surfaces of the substrate 10 in the channel holes 134, and a filling layer 140 may be formed on the channel layer 138 to sufficiently fill remaining portions of the channel holes 134. In example embodiments, the channel layer 138 may be formed to include doped or undoped polysilicon or amorphous silicon. Alternatively, the channel layer 138 is formed to include amorphous silicon or polysilicon, and the amorphous silicon layer or polysilicon may be changed to a single crystalline silicon layer by performing a laser beam treatment or a thermal treatment. The filling layer 140 may be formed to include an oxide, e.g., silicon oxide or a nitride layer, e.g., silicon nitride.

The filling layer 140, the channel layer 138 and the dielectric structure 136 may be planarized by e.g. a CMP process.

Upper portions of the filling layer 140, the channel layer 138 and the dielectric structure 136 in each of the channel holes 134 may be removed to form a recess (not shown), and a pad pattern 144 including a conductive material may be formed to fill the recess. In example embodiments, the pad pattern 144 may be formed to include polysilicon, e.g., n-type doped polysilicon. Thus, a vertical channel structure 142 including the channel layer 138 and the filling layer 140, and the dielectric structure 136 may be formed in each of the channel holes 134.

Figure 14:
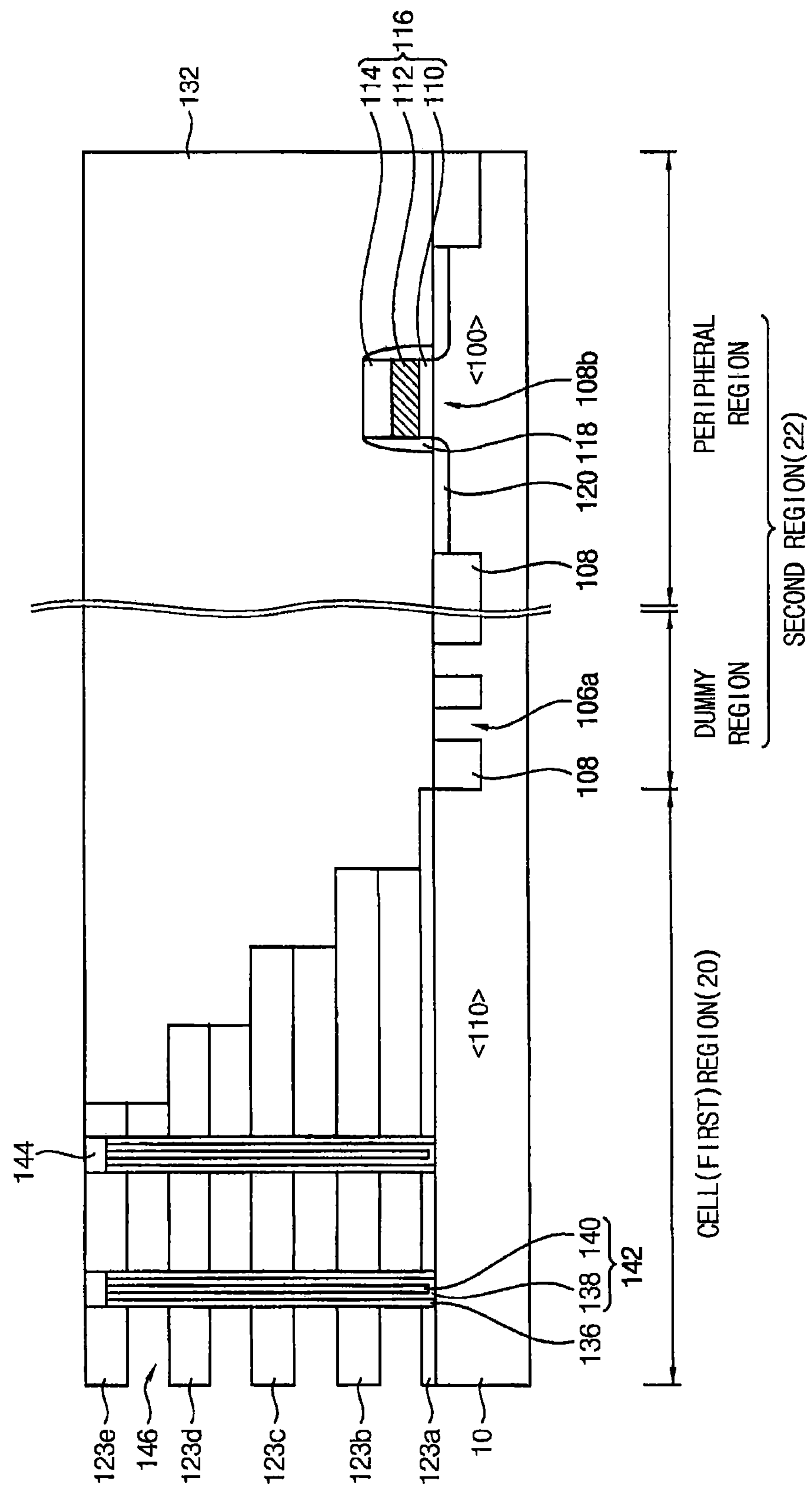

Referring to FIG. 14, the mold structure 130 may be etched to form a first opening 150 (refer to FIG. 1), and the mold structure 130 may have a linear shape extending in the first direction by forming the first opening 150.

Additionally, by forming the first opening 150, the insulating interlayers 122*a*, 122*b*, 122*c*, 122*d* and 122*e* and the sacrificial layers may be transformed into the insulating interlayer patterns 123*a*, 123*b*, 123*c*, 123*d* and 123*e* and the sacrificial layer patterns (not shown), respectively. The insulating interlayer patterns 123*a*, 123*b*, 123*c*, 123*d* and 123*e* and the sacrificial layer patterns may extend in the first direction.

The sacrificial layer patterns exposed by the first opening 150 may be removed to form the gaps 146 between insulating interlayer patterns 123*a*, 123*b*, 123*c*, 123*d* and 123*e* at adjacent levels. An outer sidewall of the dielectric structure 136, e.g. the blocking layer may be exposed by the gaps 146. In example embodiments, the sacrificial layer patterns may be removed by a wet etch process using an etchant having an etching selectivity with respect to the insulating interlayer patterns 123*a*, 123*b*, 123*c*, 123*d* and 123*e*.

Figure 15:
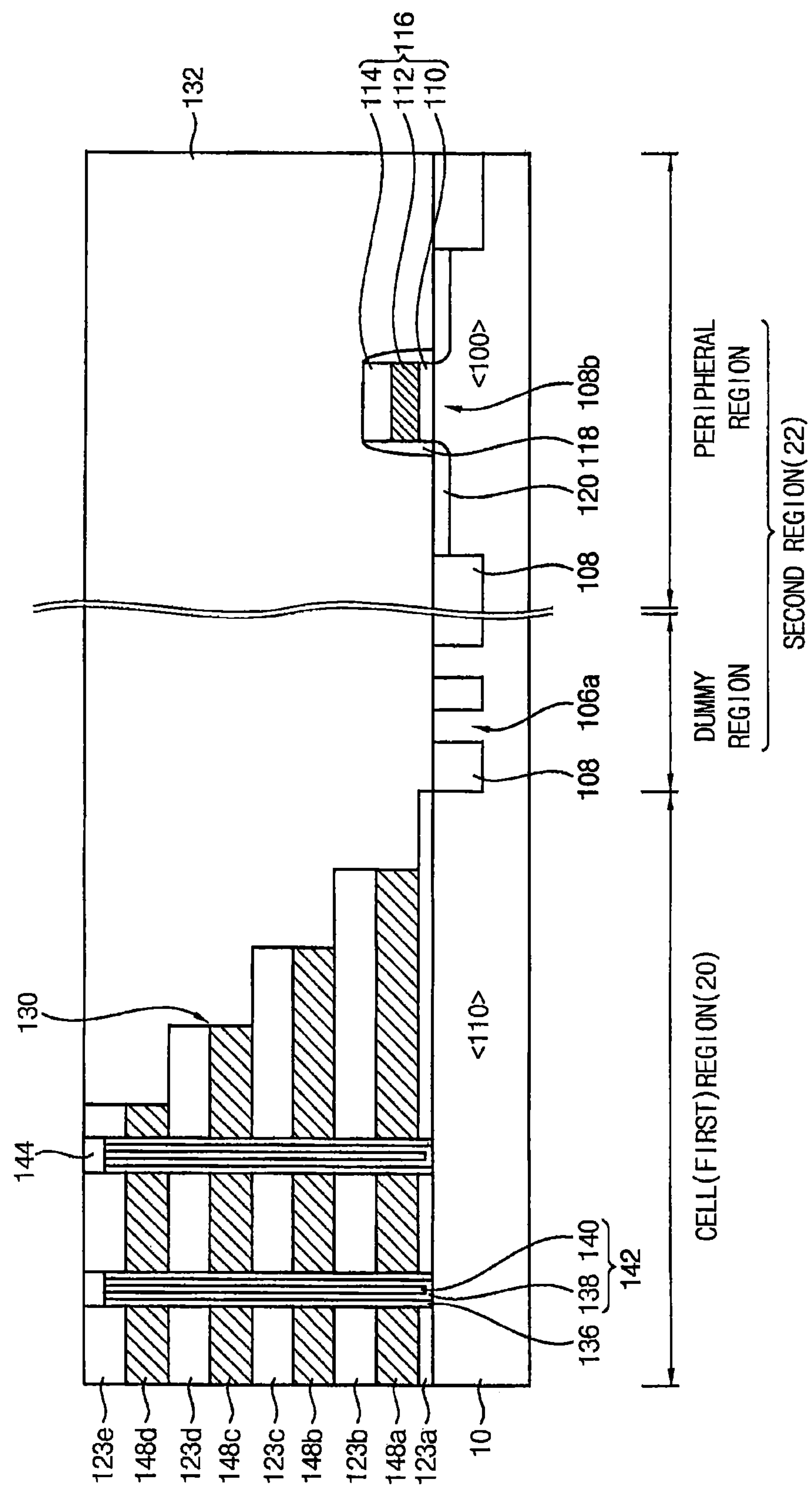

Referring to FIG. 15, gate lines 148*a*, 148*b*, 148*c* and 148*d* may be formed in the gaps 146, respectively. That is, the sacrificial layer patterns may be replaced with the gate lines 148*a*, 148*b*, 148*c* and 148*d*, respectively.

The gate lines 148*a*, 148*b*, 148*c* and 148*d* may be formed to include a metal and/or a metal nitride. For example, the gate lines 148*a*, 148*b*, 148*c* and 148*d* may be formed to include a metal having a low resistance and a low work function, e.g., tungsten, titanium, tantalum, platinum, etc., or a metal nitride thereof, e.g., titanium nitride, tantalum nitride, etc. In example embodiments, the gate lines 148*a*, 148*b*, 148*c* and 148*d* may be formed to have a barrier layer including the metal nitride and a metal layer including the metal.

The gate lines 148*a*, 148*b*, 148*c* and 148*d* may serve as a GSL, a word line and a GSL, which may be sequentially stacked from the substrate 10 upwardly in the third direction.

Impurities may be implanted into the exposed top surface of the substrate 10 in the first opening 150 to form a second impurity region (not shown), and a division pattern 152 (refer to FIG. 1) may be formed to fill the first opening 150. In example embodiments, the second impurity region may extend in the first direction and serve as a CSL.

Referring to FIG. 2 again, a second upper insulation layer 154 may be formed on the uppermost one of the insulating interlayer patterns 123*e*, the first upper insulation layer 132, the pad pattern 144, and the division pattern 152. A wiring structure (not shown) including a bit line may be formed on the second upper insulation layer 154. The bit line may be formed to extend in a direction substantially perpendicular to the extension direction of the gate lines 148*a*, 148*b*, 148*c* and 148*d*.

As described above, the vertical semiconductor device shown in FIGS. 1 and 2 may be manufactured. In the method of manufacturing the vertical semiconductor device, the crystal defect or the dislocation in the second region 22 due to the stress generated when the memory cells may be formed on the cell region 20 may be decreased. Thus, electrical defects or failures of the transistor formed on the second region 22 such as leakage currents may be decreased.

Figure 16:
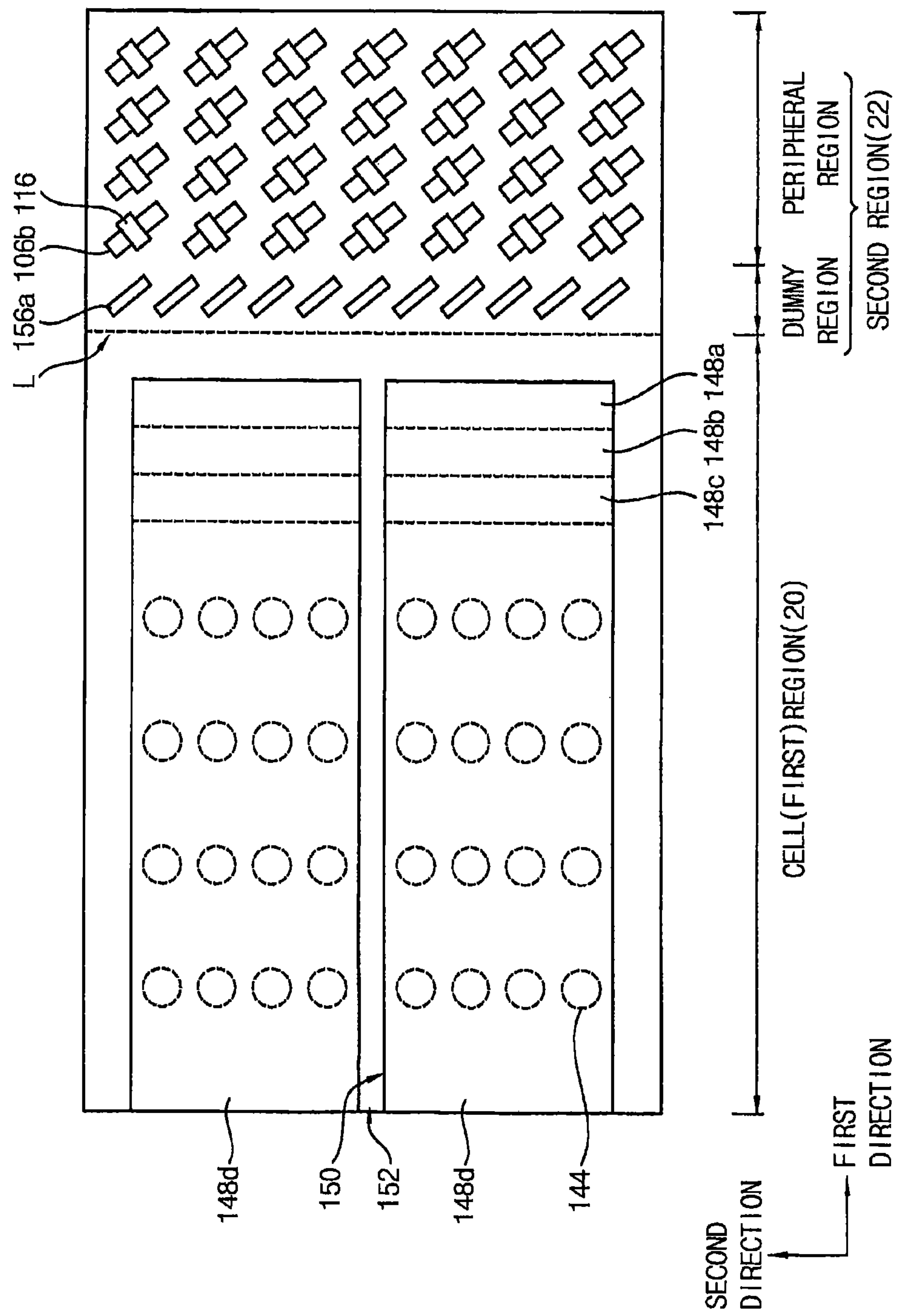

FIG. 16 is a plan view illustrating a vertical semiconductor device in accordance with other example embodiments. The vertical semiconductor device of FIG. 16 may be substantially the same as that of FIG. 1, except for the shape of the first active pattern.

Referring to FIG. 16, a substrate may include silicon and may have the (100) crystalline plane. Thus, the substrate may be referred to as a (100) silicon wafer.

The substrate may include a first region 20 and a second region 22. The first region 20 may serve as a cell region for forming memory cells, and the second region 22 may include a dummy region and a peripheral region. The first region 20 may have a quadrilateral shape, such as a rectangular shape, having four sides extending in the first and second directions. Thus, each of boundary lines L of the first region 20 may extend in the first direction or in the second direction.

The memory cells may be stacked on the first region 20 in the third direction substantially perpendicular to the top surface of the substrate. In example embodiments, the memory cells may be substantially the same as or similar to that illustrated with reference to FIGS. 1 and 2. However, the structure of the memory cells may not be limited thereto, and the memory cells may have various other structures A first active region 156*a* may be formed in the dummy region of the second region 22. The first active region 156*a* may serve as a dummy active region on which no actual circuits may be formed. The first active region 156*a* may reduce or prevent elements from being polished or removed on the second region 22 when a chemical mechanical polishing (CMP) process is performed.

A longitudinal direction of the first active region 156*a* may be disposed to have an oblique angle, such as an acute angle, with the <110> direction. The first active region 156*a* may a direction different from the <110> direction. That is, the first active region 156*a* may be neither perpendicular nor parallel to the boundary line (L) of the first region 20, but may have an oblique angle, such as an acute angle, therewith. In example embodiments, a plurality of first active regions 156*a* may be formed, and the plurality of first active regions 156*a* may be regularly arranged along the boundary line (L) of the first region 20. In example embodiments, the first active region 156*a* may be disposed to have an angle of about 10 degrees to about 80 degrees to the boundary line (L) of the first region 20. When the first active region 156*a* is disposed to have an angle of 45 degrees to the boundary line (L) of the first region 20, the first active region 156*a* may be disposed in the <100> direction. The first active region 156*a* may be disposed in a direction different from the <110> direction, so that the stress of the substrate may decrease. Although a thermal stress and/or a mechanical stress may be applied to the second region 22 from the first region, the first active region 156*a* may have a relatively small stress. A stress transferred to the second active region 106*b* of the peripheral region may decrease.

A peripheral circuit of the vertical semiconductor memory device may be formed on the peripheral region of the second region 22. The peripheral circuit may include a CMOS transistor.

The second active region 106*b* may be disposed to have an oblique angle, such as an acute angle, with the <110> direction. That is, a longitudinal direction of the second active region 106*b* may be neither perpendicular nor parallel to the boundary line (L) of the first region 20, but may have an oblique angle, such as an acute angle, therewith. Thus, the second active region 106*b* may be disposed in a direction different from the <110> direction. In example embodiments, the second active region 106*b* may be disposed to have an angle of about 10 degrees to about 80 degrees to the boundary line (L) of the first region 20. The second active region 106*b* may be disposed substantially the same as or similar to that illustrated with reference to FIG. 1. Thus, a crystal defect or a dislocation in the second active region 156*b* due to a compressive stress from the first region 20 to the second active region 156*b* may decrease.

A gate structure 116 including a gate insulation layer pattern, a gate electrode and a gate mask may be formed on the second active region 106*b* of the substrate 10. In example embodiments, the gate structure 116 may be disposed in a direction substantially perpendicular to the longitudinal direction of the second active region 106*b*. That is, the gate structure 116 may be disposed in a direction different from the <100> direction, so that the stress of the substrate may decrease.

A first impurity region may be formed at an upper portion of the second active region 106*b* adjacent to the gate structure 116. A CMOS transistor may include the gate structure 116 and the first impurity region.

According as the crystal defect or the dislocation in the second active region 106*b* may decrease, electrical defects or failures of the transistor such as leakage currents may be decreased.

Figure 17:
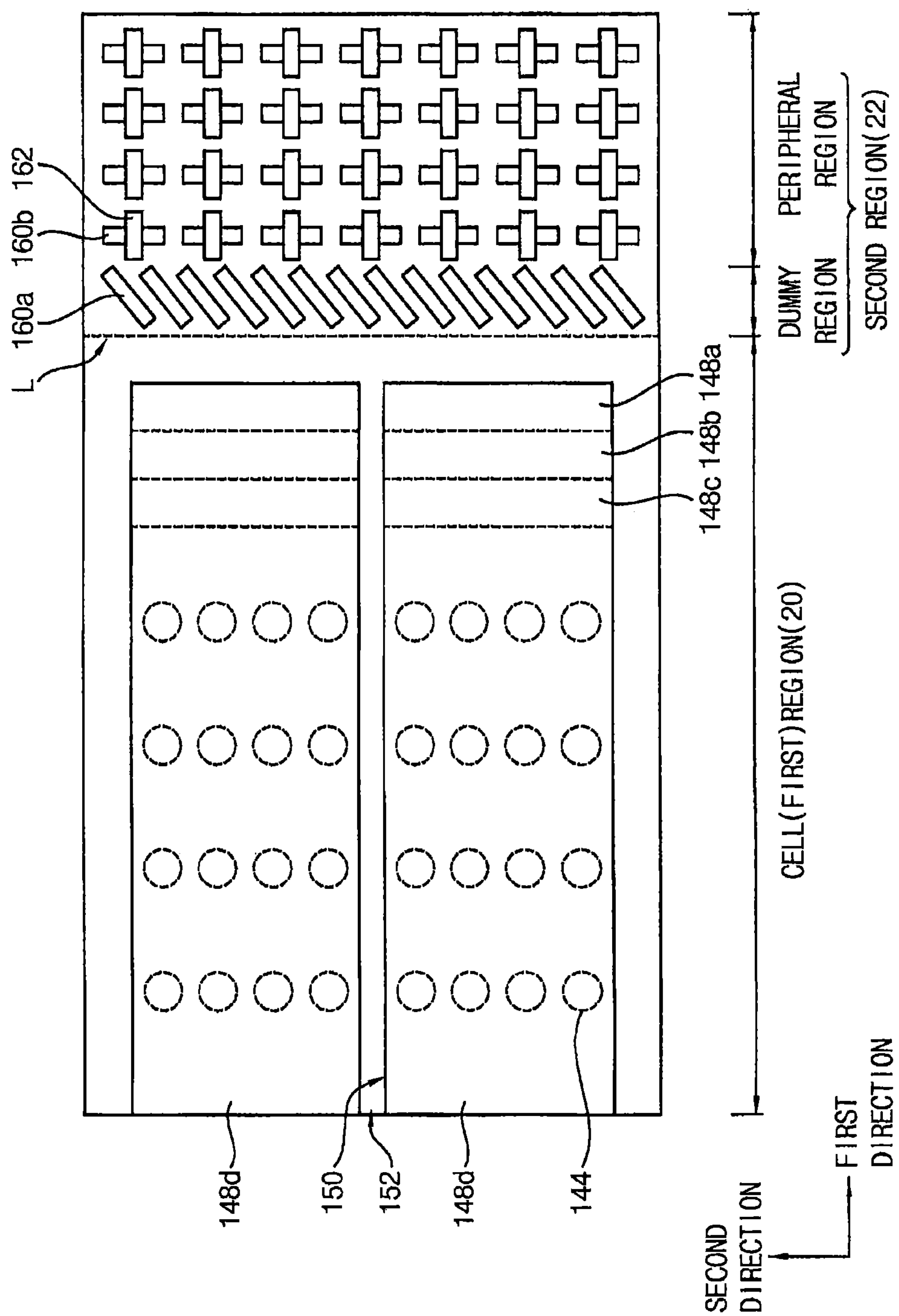

FIG. 17 is a plan view illustrating a vertical semiconductor device in accordance with still other example embodiments.

Referring to FIG. 17, a substrate may include silicon and may have the (100) crystalline plane. Thus, the substrate may be referred to as a (100) silicon wafer.

The substrate may include a first region 20 and a second region 22. The first region 20 may serve as a cell region for forming memory cells, and the second region 22 may include a dummy region and a peripheral region. The first region 20 may have a quadrilateral shape, such as a rectangular shape, having four sides extending in the first and second directions. Thus, each of boundary lines L of the first region 20 may extend in the first direction or in the second direction.

The memory cells may be stacked on the first region 20 in the third direction substantially perpendicular to the top surface of the substrate. In example embodiments, the memory cells may be substantially the same as or similar to that illustrated with reference to FIGS. 1 and 2. However, the structure of the memory cells may not be limited thereto, and the memory cells may have various other structures A first active region 160*a* may be formed in the dummy region of the second region 22. The first active region 160*a* may serve as a dummy active region on which no actual circuits may be formed. The first active region 160*a* may reduce or prevent elements from being polished or removed on the second region 22 when a chemical mechanical polishing (CMP) process is performed.

A longitudinal direction of the first active region 160*a* may be disposed to have an oblique, e.g., acute angle, with the <110> direction. That is, the first active region 160*a* may be neither perpendicular nor parallel to the boundary line (L) of the first region 20, but may have an acute angle therewith. In example embodiments, a plurality of first active regions 160*a* may be regularly arranged along the boundary line (L) of the first region 20. The first active region 160*a* may a direction different from the <110> direction. In example embodiments, the first active region 160*a* may be disposed to have an angle of about 10 degrees to about 80 degrees to the boundary line (L) of the first region 20. When the first active region 160*a* is disposed to have an angle of 45 degrees to the boundary line (L) of the first region 20, the first active region 160*a* may be disposed in the <100> direction. The first active region 160*a* may be disposed in a direction different from the <110> direction, so that the stress of the substrate may decrease. Although a thermal stress and/or a mechanical stress may be applied to the second region 22 from the first region, the first active region 160*a* may have a relatively small stress. A stress transferred to the second active region 160*b* of the peripheral region may decrease.

A peripheral circuit of the vertical semiconductor memory device may be formed on the peripheral region of the second region 22. The peripheral circuit may include a CMOS transistor.

The second active region 160*b* may be disposed in a direction substantially perpendicular or parallel to the boundary line (L) of the first region 20. In example embodiments, the second active region 160*b* may be parallel to the boundary line (L) of the first region 20, as shown in FIG. 17. The second active region 160*b* may be disposed in the second direction. That is, the second active region may be disposed in the <110> direction, The stress transferred to the second active region 160*b* is decreased. Thus, the stress of the second active region 160*b* may decrease, although the second active region 160*b* may be disposed in the <110> direction.

A gate structure 162 including a gate insulation layer pattern, a gate electrode, and a gate mask may be formed on the second active region 160*b* of the substrate. In example embodiments, the gate structure 162 may be disposed in a direction substantially perpendicular to the longitudinal direction of the second active region 160*b*. The gate structure 162 may be disposed in the first direction. That is, the gate structure 162 may be disposed in the <110> direction.

A first impurity region may be formed at an upper portion of the second active region 160*b* adjacent to the gate structure 162. A CMOS transistor may include the gate structure 162 and the first impurity region.

Accordingly, as the crystal defect or the dislocation in the second active region 160*b* may decrease, electrical defects or failures of the transistor such as leakage currents may be decreased.

Figure 18:
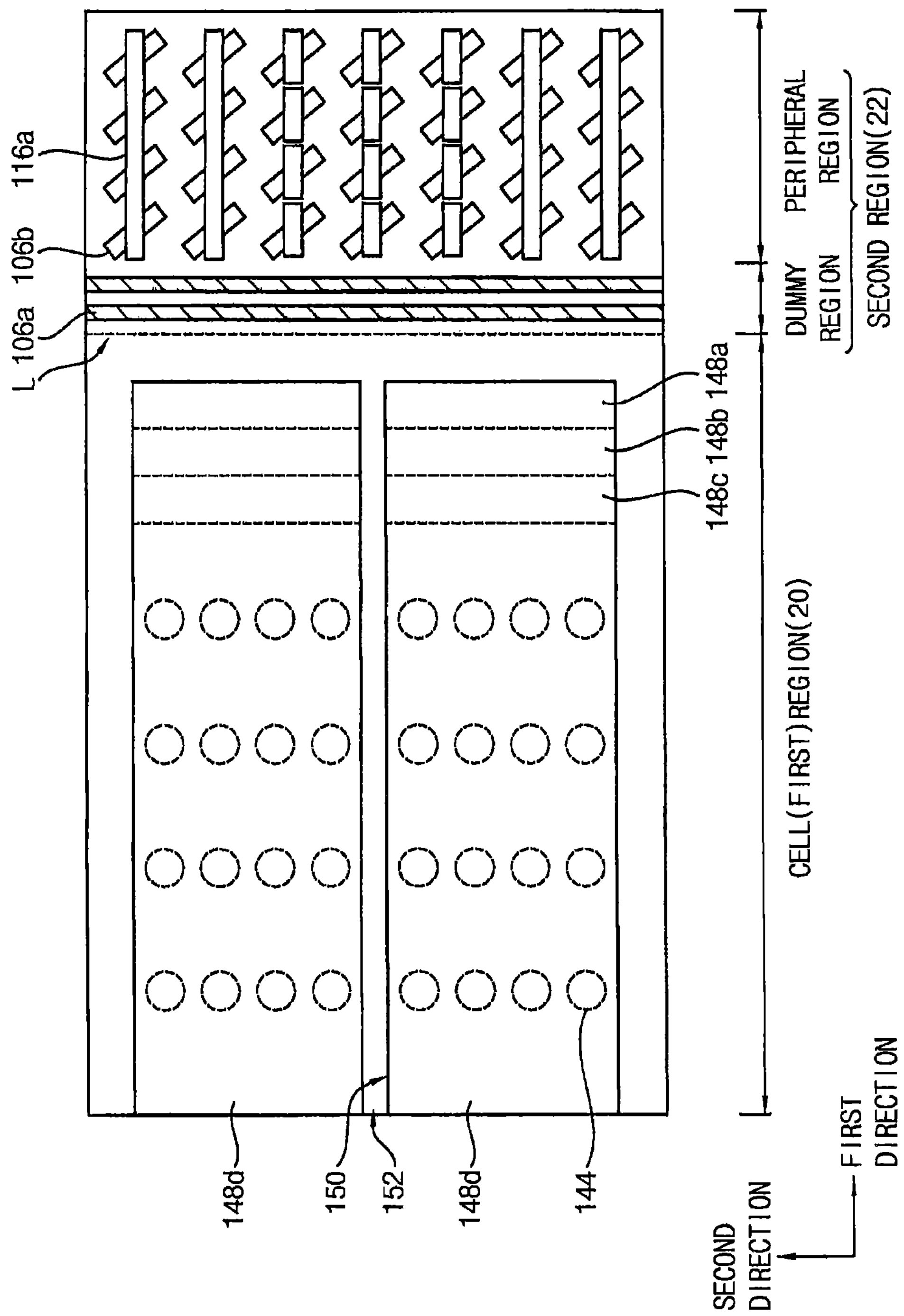

FIG. 18 is a plan view illustrating a vertical semiconductor device in accordance with still other example embodiments.

Referring to FIG. 18, a substrate may include silicon and may have the (100) crystalline plane. Thus, the substrate may be referred to as a (100) silicon wafer. The substrate may include a first region 20 and a second region 22.

Memory cells may be stacked on the first region 20 in the third direction substantially perpendicular to the top surface of the substrate. In example embodiments, the memory cells may be substantially the same as or similar to that illustrated with reference to FIGS. 1 and 2. However, the structure of the memory cells may not be limited thereto, and the memory cells may have various other structures.

A first active region 106*a* may be formed in a dummy region of the second region 22. The first active region 106*a* may serve as a dummy active region on which no actual circuits may be formed. In example embodiments, the first active region 106*a* may be substantially the same as or similar to that illustrated with reference to FIGS. 1 and 2. In other example embodiments, the first active region 106*a* may be substantially the same as or similar to that illustrated with reference to FIG. 16.

A peripheral circuit of the vertical semiconductor memory device may be formed on the peripheral region of the second region 22. The peripheral circuit may include a CMOS transistor.

A second active region 106*b* may be disposed to have an oblique, and in some embodiments an acute, angle with the <110> direction. That is, a longitudinal direction of the second active region 106*b* may be neither perpendicular nor parallel to the boundary line (L) of the first region 20, but may have an acute angle therewith. Thus, a crystal defect or a dislocation in the second active region 106*b* due to a compressive stress from the first region 20 to the second active region 106*b* may decrease.

A gate structure 116 including a gate insulation layer pattern 110, a gate electrode 112 and a gate mask 114 may be formed on the second region 22 of the substrate 10. The gate structure 116 may be disposed in the first or second direction. In example embodiments, the gate structure 116*a* may be disposed in the first direction. That is, the gate structure 116*a* may be disposed in the <110> direction.

A first impurity region may be formed at an upper portion of the second active region 106*b* adjacent to the gate structure 116*a*. A CMOS transistor may include the gate structure 116*a* and the first impurity region.

Accordingly, as the crystal defect or the dislocation in the second active region 106_b_ may decrease, electrical defects or failures of the transistor such as leakage currents may be decreased.

Figure 19:
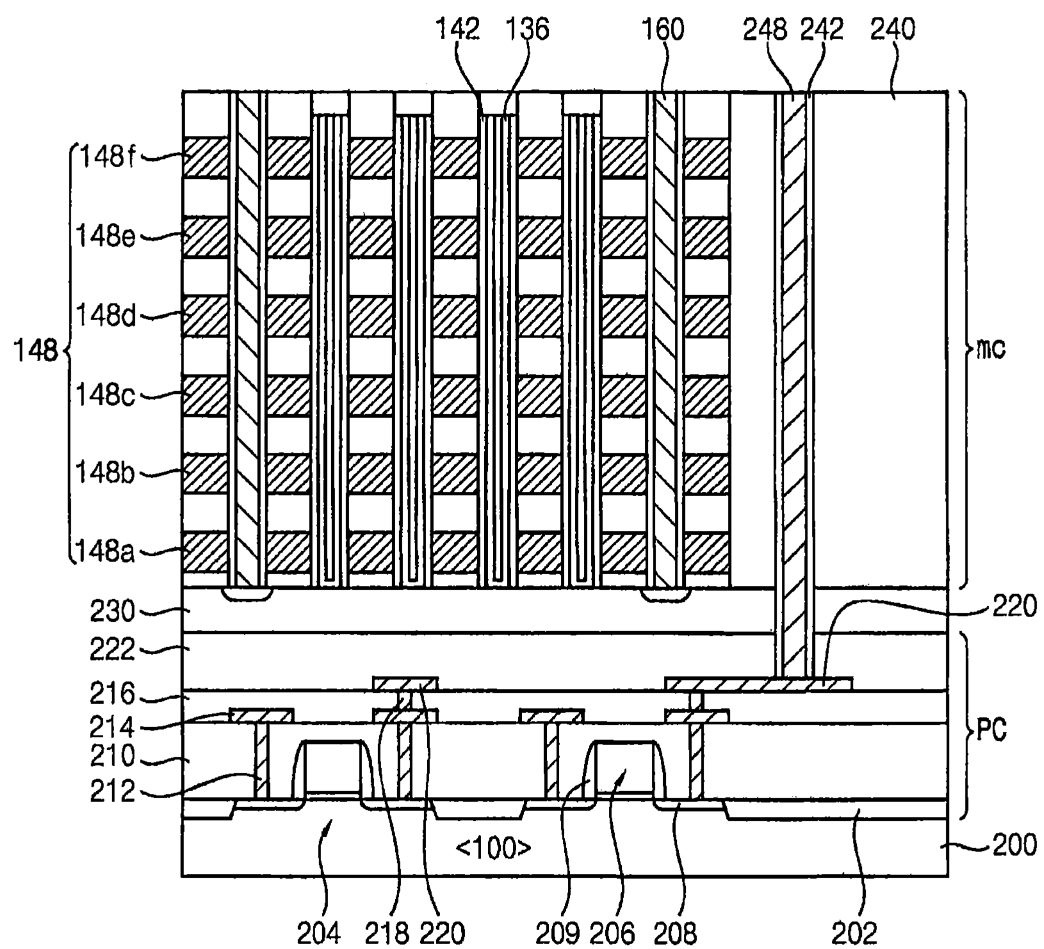

FIG. 19 is a cross-sectional view illustrating a vertical semiconductor device in accordance with still other example embodiments.

Referring to FIG. 19, the vertical type semiconductor device may include a peripheral circuit structure PC, a base layer 230, and a memory cell structure MC sequentially stacked on the substrate 200.

The substrate 200 may include silicon, and a crystal orientation of the substrate in first and second directions, which may be substantially parallel to a top surface of the substrate 200 and substantially perpendicular to each other, may be the <110> direction. The first direction may be substantially parallel to the orientation of a notch or a flat zone of the substrate 200.

An isolation layer pattern 202 may be formed at the substrate 200, and a field region and an active region 204 may be defined in the substrate 200 by the isolation layer pattern 202. A CMOS transistor including a gate structure 206 and an impurity region 208 may be formed on the substrate 200. The CMOS transistor may serve as the peripheral circuit structure.

The active region 204 may be substantially the same as or similar to as the second active region of FIG. 1, and thus the active region 204 may be disposed to have an oblique angle, and in some embodiments an acute angle, with the <110> direction. The active region 204 may be disposed to have an angle of about 10 degrees to about 80 degrees to the first direction. When the active region 204 is disposed to have an angle of 45 degrees to the first direction, the active region 204 may be disposed in the <100> direction.

The active region 204 may be disposed in a direction different from the <110> direction, so that the stress of the substrate 200 may decrease. Thus, a crystal defect or a dislocation in the active region 204 may decrease, and electrical defects or failures of the peripheral circuit structure on the active region 204 may decrease.

The gate structure 206 may include a gate insulation layer pattern, a gate electrode and a gate mask, and the gate structure may be formed on the active region 22. In example embodiments, gate spacers 209 may be further formed on sidewalls of the gate structure 206.

A first lower insulation layer 210 may be formed on, and in some embodiments to cover, the peripheral circuit structure on the substrate 200. A first contact plug 212 may be formed through the first lower insulation layer 210 to be electrically connected to the impurity region 208. A first electrode pattern 214 may be formed on the first lower insulation layer 210 to contact the first contact plug 212. A second lower insulation layer 216 may be formed on, and in some embodiments to cover, the first electrode pattern 214 on the first lower insulation layer 210. A second contact plug 218 may be formed through the second lower insulation 216 layer to be electrically connected to the first electrode pattern 214, and a second electrode pattern 220 may be formed on the second lower insulation layer 216 to contact the second contact plug 218. A third lower insulation layer 222 may be formed on, and in some embodiments to cover, the second electrode pattern 220 on the second lower insulation layer 216. In example embodiments, a wiring structure including the first and second contact plugs 212 and 218 and the first and second electrode patterns 214 and 220 may be formed to have two levels. However, the numbers of the wiring structure may not be limited thereto.

The first, second and third lower insulation layers 210, 216 and 222 may include an oxide, e.g., silicon oxide. The first and second contact plugs 212 and 218 and the first and second electrode patterns 214 and 220 may include, e.g., a metal, a metal nitride, doped polysilicon, etc.

The base layer 230 may be formed on the third lower insulation layer 222. The base layer 230 may include, e.g., doped polysilicon. The base layer 230 may be doped with p-type impurities, e.g., boron (B), gallium (Ga), etc, and thus the base layer 230 may serve as a p-well.

The memory cell structure MC may be formed on the base layer 230. The memory cell structure MC may include a vertical channel structure 142, a dielectric structure 136, a plurality of gate lines 148_a_, 148_b_, 148_c_, 148_d_, 148_e_ and 148_f_, and a bit line (not shown).

The memory cell structure MC may include a plurality of memory cells sequentially stacked. In example embodiments, the memory cells may be substantially the same as or similar to that illustrated with reference to FIG. 1. However, the structure of the memory cells may not be limited thereto, and the memory cells may have various other structures An insulation layer 240 may be formed on, and in some embodiments to cover, sidewalls of the memory cell structure MC on the base layer 230. A contact plug 248 may be formed through the insulation layer 240 to be electrically connected to the memory cell structure MC and the peripheral circuit structure PC. In example embodiments, the contact plug 248 may be formed to contact the second electrode pattern 220. An insulation pattern 242 may be formed on a sidewall of the contact plug 248 to surround a sidewall of the contact plug 248.

As described above, the peripheral circuit structure PC may be formed on the substrate 200, and the memory cell structure MC may de formed over the peripheral circuit structure PC. Thus, a integration degree of the vertical semiconductor device may increase. The active region 204 in which the peripheral circuit structure PC may be formed may be disposed in a direction different from the <110> direction, so that the stress of the substrate 200 may decrease. Thus, electrical defects or failures of peripheral circuit structure PC may decrease.

Figure 20:
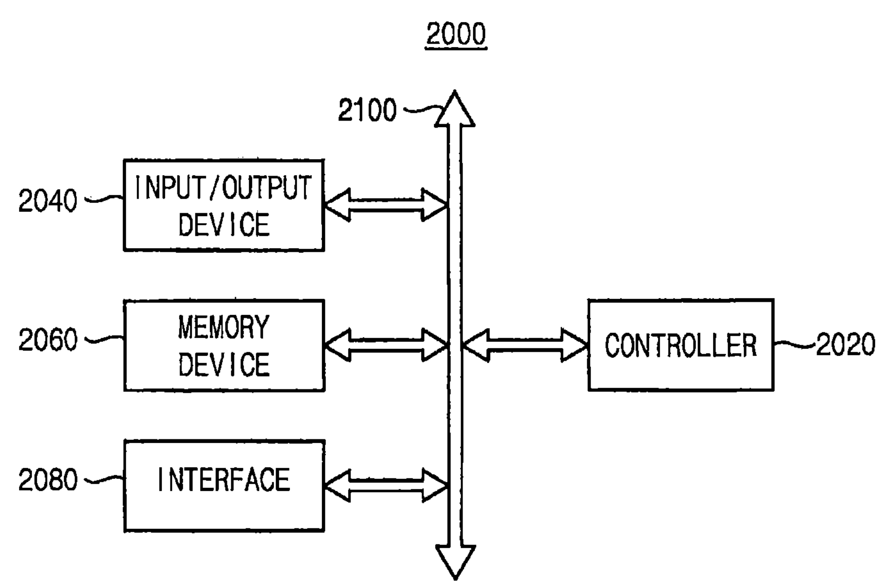

FIG. 20 is a block diagram illustrating an electronic system including a semiconductor device in accordance with example embodiments.

Referring to FIG. 20, an electronic system 2000 of this example embodiment may include a controller 2020, an input/output device 2040, a memory device 2060, an interface 2080 and a bus 2100. The controller 2020, the input/output device 2040, the memory device 2060 and/or the interface 2080 may be coupled with each other via the bus 2100. The bus 2100 may serve as a path through which data may be transmitted.

In example embodiments, the controller 2020 may include a microprocessor, a digital signal processor, a microcontroller and/or logic devices having functions substantially similar to the microprocessor, the digital signal processor and the microcontroller. The input/output device 2040 may include a keypad, a keyboard and/or a display unit, etc. The memory device 2060 may store the data and/or commands. The memory device 2060 and/or any of the other blocks of FIG. 20 may include any one of the semiconductor devices in above-mentioned example embodiments. Additionally, the memory device 2060 may further include other semiconductor devices such as a flash memory device, a DRAM device and/or an SRAM device, etc. The interface 2080 may transmit the data to a communication network. The interface 2080 may receive the data from the communication network. The interface 2080 may have a wired structure or a wireless structure. For example, the interface 2080 may include an antenna, a wired or wireless transceiver, etc. The electronic system 2000 may further include operational memory device for improving operations of the controller 2020 such as a DRAM device and/or an SRAM device, etc., having a high operational speed.

In example embodiments, the electronic system 2000 may be applied to electronic articles such as a personal digital assistant (PDA), a portable computer, a web tablet, a wireless phone, a mobile phone, a digital music player and/or a memory card, etc.

While example embodiments have been particularly shown and described, it will be understood by one of ordinary skill in the art that variations in form and detail may be made therein without departing from the spirit and scope of the claims.

What is claimed is:

1. A semiconductor device comprising:

a plurality of memory cells on a first region of a substrate;

a peripheral circuit on a second region of the substrate; and a dummy active region on a dummy region between the first region and the second region of the substrate, wherein a top surface of the dummy active region is disposed substantially a same level as a top surface of the substrate, wherein each of the memory cells comprises a word line extending in a first direction, and wherein a longitudinal direction of the dummy active region is different from the first direction.

2. The semiconductor device of claim 1, wherein the dummy active region has a linear shape and extends in a third direction that is substantially parallel to a boundary line of the first region.

3. The semiconductor device of claim 2, wherein the dummy active region includes a plurality of dummy active regions extending in parallel with each other.

4. The semiconductor device of claim 1, wherein the dummy active region extends in a direction substantially perpendicular to the first direction.

5. The semiconductor device of claim 1, the dummy active region extends in a direction having an acute angle with the first direction.

6. The semiconductor device of claim 1, the dummy active region extends in a direction having an angle of about 10 degrees to about 80 degrees with a <110> direction of the substrate.

7. The semiconductor device of claim 1, wherein the dummy active region has no actual circuits therein.

8. The semiconductor device of claim 1, further comprising an active region in the second region, the active region having an oblique angle with a <110> direction of the substrate.

9. The semiconductor device of claim 8, wherein the longitudinal direction of the dummy active region is different from a longitudinal direction of the active region.

10. The semiconductor device of claim 8, wherein the longitudinal direction of the dummy active region is parallel to a longitudinal direction of the active region.

11. The semiconductor device of claim 1, wherein the dummy active region is a portion of the dummy region between trenches of the substrate.

12. A semiconductor device comprising:

a first region of a substrate;

a second region of the substrate; and a dummy region between the first and second regions of the substrate, wherein the dummy region includes a plurality of dummy active regions extending in a direction, wherein the direction of each of the dummy active regions has an angle of about 10 degrees to about 80 degrees with a <110> direction of the substrate, and wherein a top surface of each of the dummy active regions is at substantially a same level as a top surface of the substrate.

13. The semiconductor device of claim 12, further comprising a plurality of memory cells on the first region, wherein each of the memory cells includes a word line.

14. The semiconductor device of claim 13, wherein the direction is a longitudinal direction of each of the dummy active regions and is different from a direction in which the word line extends.

15. A semiconductor device comprising:

a cell region and a peripheral region of a substrate; and a dummy region adjacent to the cell region of the substrate, wherein the dummy region includes a dummy active region not comprising transistors therein, wherein the peripheral region includes an active region having an oblique angle with a <110> direction of the substrate, and wherein a top surface of the dummy active region is at substantially a same level as a top surface of the substrate.

16. The semiconductor device of claim 15, wherein the dummy active region has a linear shape and extends in a direction substantially parallel to a boundary line of the cell region.

17. The semiconductor device of claim 15, further comprising a plurality of memory cells on the cell region, wherein each of the memory cells includes a word line extending in a first direction.

18. The semiconductor device of claim 17, wherein a longitudinal direction of the dummy active region is different from the first direction.

* * * * *